(12) United States Patent
Yi et al.

(10) Patent No.: US 11,309,494 B2
(45) Date of Patent: Apr. 19, 2022

(54) COPOLYMER AND ORGANIC LIGHT EMITTING DEVICE COMPRISING SAME

(71) Applicant: LG Chem, Ltd., Seoul (KR)

(72) Inventors: Yeonhui Yi, Daejeon (KR); Jinseck Kim, Daejeon (KR); Jaesoon Bae, Daejeon (KR); Jaechol Lee, Daejeon (KR); Soyoung Yu, Daejeon (KR); Jae Hak Jeong, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/615,535

(22) PCT Filed: Oct. 17, 2018

(86) PCT No.: PCT/KR2018/012242
§ 371 (c)(1),
(2) Date: Nov. 21, 2019

(87) PCT Pub. No.: WO2019/088516
PCT Pub. Date: May 9, 2019

(65) Prior Publication Data
US 2020/0185611 A1      Jun. 11, 2020

(30) Foreign Application Priority Data

Oct. 30, 2017 (KR) .................. 10-2017-0142808

(51) Int. Cl.
*H01L 51/00* (2006.01)
*C08G 61/12* (2006.01)
(Continued)

(52) U.S. Cl.
CPC .......... *H01L 51/0039* (2013.01); *C08G 61/12* (2013.01); *C09D 165/00* (2013.01);
(Continued)

(58) Field of Classification Search
CPC ................ C08G 61/12; C08G 2261/12; C08G 2261/1412; C08G 2261/1424;
(Continued)

(56) References Cited

U.S. PATENT DOCUMENTS 8,993,124 B2   3/2015   Nakatani et al.
8,999,523 B2   4/2015   Nakatani
(Continued)

FOREIGN PATENT DOCUMENTS

JP    2010215886 A    9/2010
JP    2014-001327 A   1/2014
(Continued)

OTHER PUBLICATIONS

International Search Report from PCT/KR2018/012242 dated Jan. 21, 2019.
(Continued)

*Primary Examiner* — Shane Fang
(74) *Attorney, Agent, or Firm* — Lerner, David, Littenberg, Krumholz & Mentlik, LLP

(57) ABSTRACT

The present specification provides a copolymer including a unit of Chemical Formula 1 and a unit of Chemical Formula 2; and an organic light emitting device including the same.

14 Claims, 4 Drawing Sheets

(51) Int. Cl.
*C09D 165/00* (2006.01)
*H01L 51/50* (2006.01)
*H01L 51/56* (2006.01)

(52) U.S. Cl.
CPC ...... *H01L 51/0043* (2013.01); *C08G 2261/12* (2013.01); *C08G 2261/148* (2013.01); *C08G 2261/1412* (2013.01); *C08G 2261/1424* (2013.01); *C08G 2261/95* (2013.01); *H01L 51/5056* (2013.01); *H01L 51/5072* (2013.01); *H01L 51/5088* (2013.01); *H01L 51/5092* (2013.01); *H01L 51/56* (2013.01)

(58) Field of Classification Search
CPC ........ C08G 2261/148; C08G 2261/195; C08G 2261/3162; C08G 2261/76; C08G 2261/95; C09D 165/00; C08L 79/02; H01L 51/0039; H01L 51/0043; H01L 51/5056; H01L 51/5072; H01L 51/5088; H01L 51/5092; H01L 51/56

See application file for complete search history.

(56) References Cited

U.S. PATENT DOCUMENTS

| | | |
|---|---|---|
| 9,929,347 B2 | 3/2018 | Sekine et al. |
| 2011/0127516 A1* | 6/2011 | Nakatani ............... C08G 61/12 257/40 |
| 2015/0115204 A1 | 4/2015 | Sekine et al. |
| 2017/0283546 A1 | 10/2017 | Sakakibara et al. |

FOREIGN PATENT DOCUMENTS

| | | |
|---|---|---|
| KR | 10-2011-0043717 A | 4/2011 |
| KR | 10-2011-0051204 A | 5/2011 |
| KR | 10-2014-0148424 A | 12/2014 |
| KR | 20190048098 A | 5/2019 |
| KR | 20190048103 A | 5/2019 |
| KR | 20190048149 A | 5/2019 |
| WO | 2013146806 A1 | 10/2013 |
| WO | 2016047536 A1 | 3/2016 |

OTHER PUBLICATIONS

Cha, S.J. et al., "Thermally Cross-linkable Hole Transport Polymers for Solution-based Organic Light-emitting Diodes", Macromolecular Rapid Communications, 2014, vol. 35, No. 8, pp. 807-812.

* cited by examiner

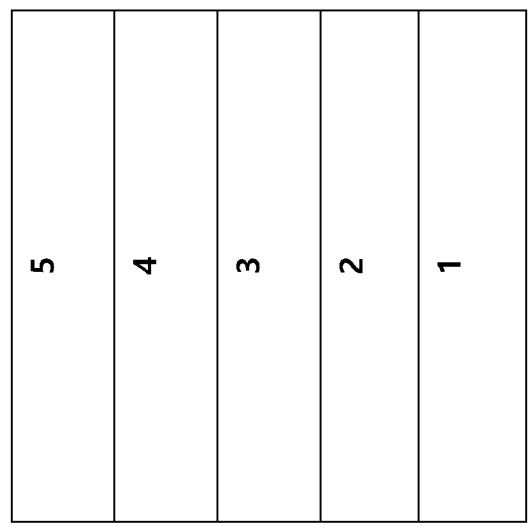
[FIG. 1]

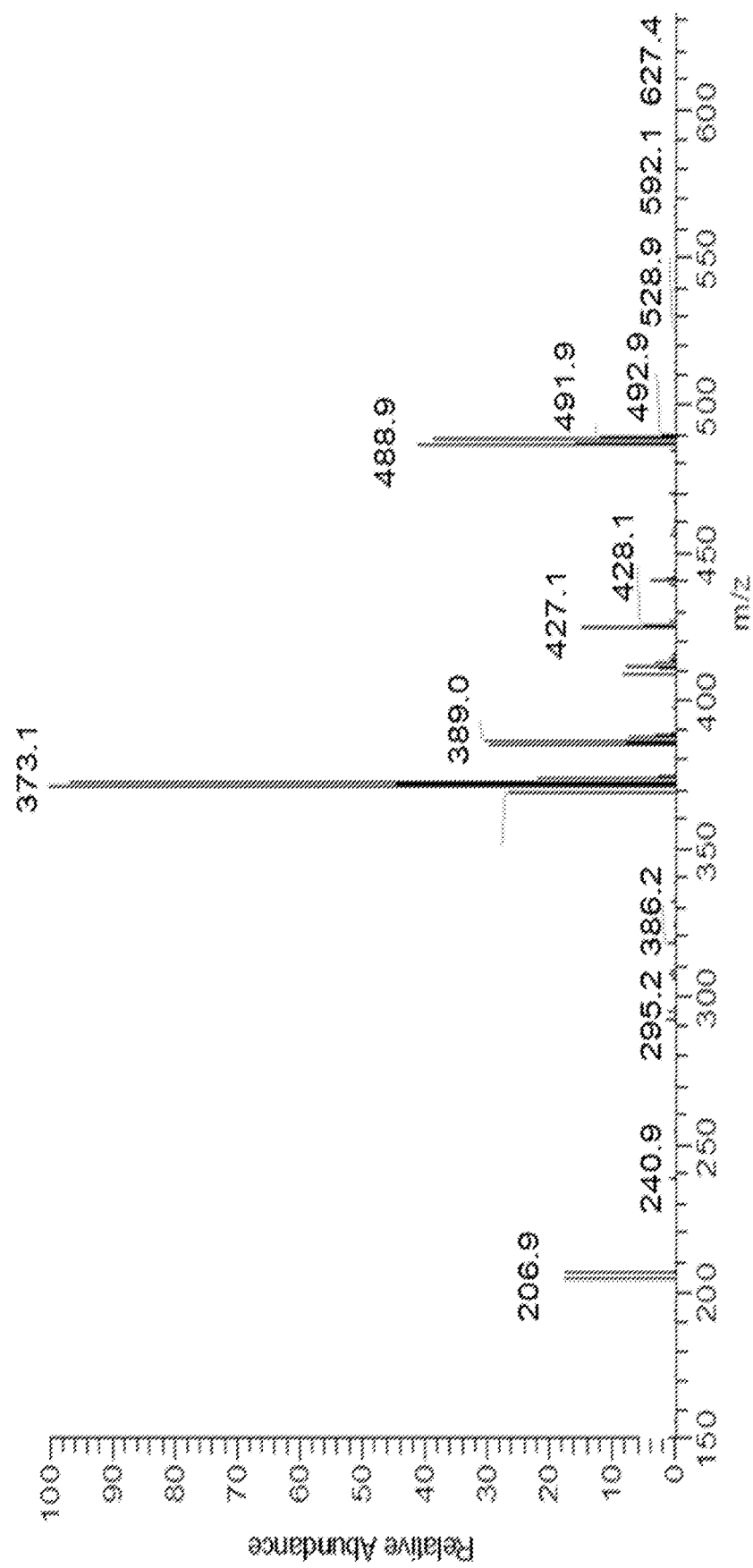
[FIG. 2]

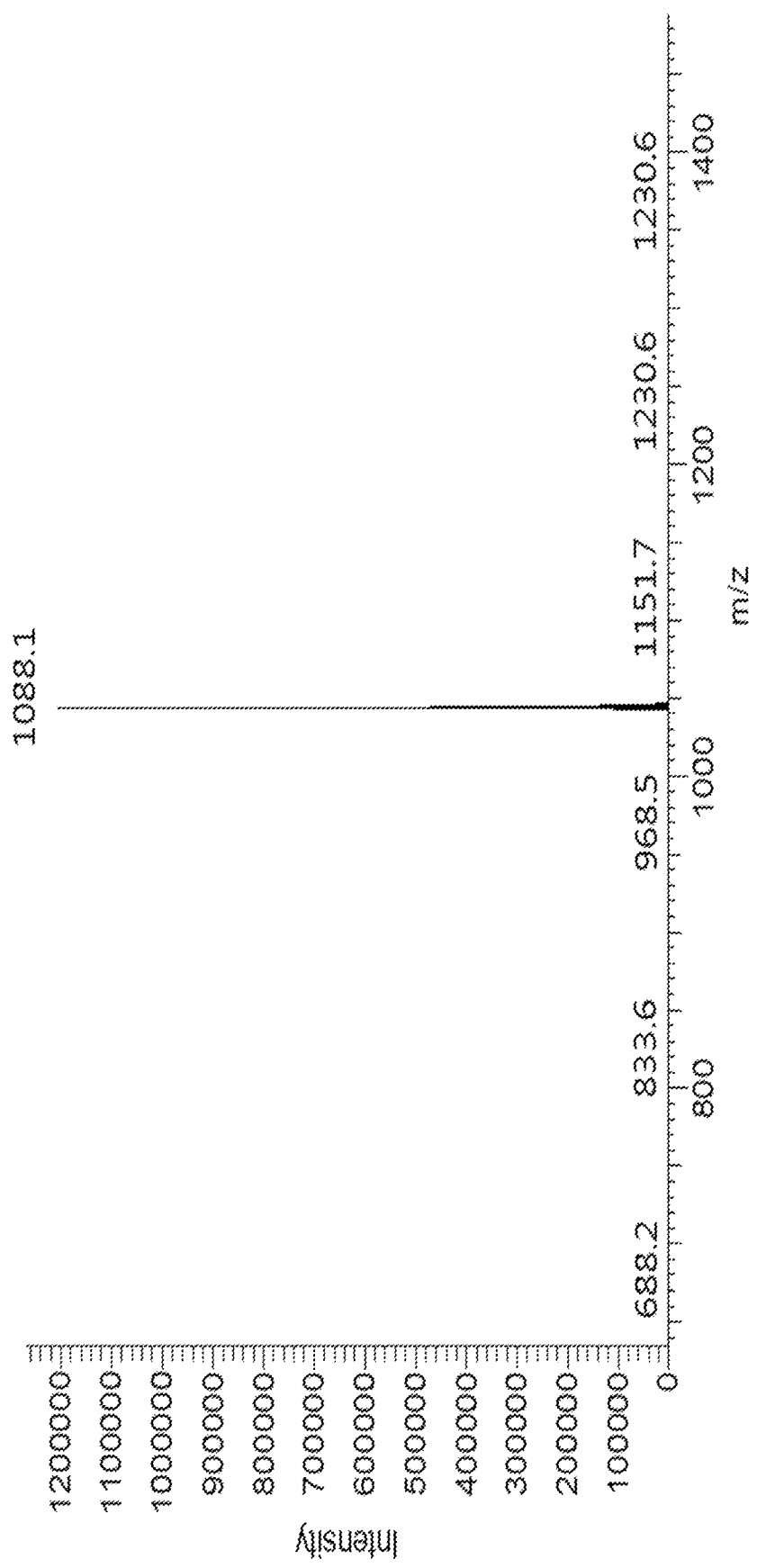
[FIG. 3]

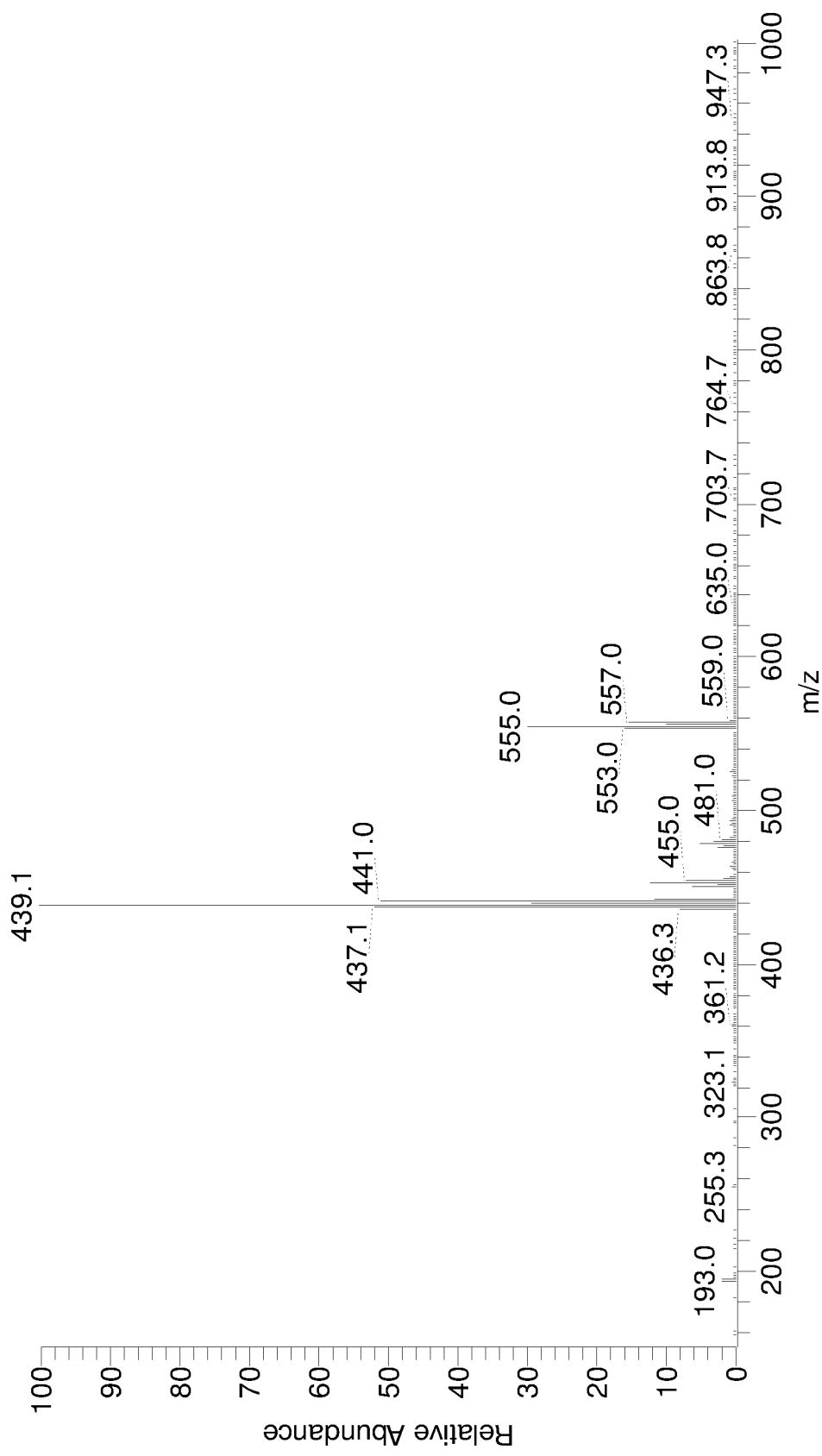
[FIG. 4]

COPOLYMER AND ORGANIC LIGHT EMITTING DEVICE COMPRISING SAME

CROSS-REFERENCE TO RELATED APPLICATIONS

The present application is a national phase entry under 35 U.S.C. § 371 of International Application No. PCT/KR2018/012242 filed Oct. 17, 2018, which claims priority from Korean Patent Application No. 10-2017-0142808 filed Oct. 30, 2017, all of which are incorporated herein by reference.

TECHNICAL FIELD

The present specification relates to a copolymer, a coating composition including the copolymer, an organic light emitting device formed using the coating composition, and a method for manufacturing the same.

BACKGROUND ART

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, may be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

In OLEDs, blue light emission has used a fluorescence phenomenon that is relatively superior in performance and lifetime compared to phosphorescence, and this also applies to soluble OLEDs. A decrease in the lifetime due to triplet excitation in blue light emission of OLEDs is well known in the art. Accordingly, an OLED device lifetime may be enhanced when effectively quenching excited triplet. Excited triplet is mostly present in an EML layer but may migrate to an interface of HTL or an HTL layer, and therefore, some of HTL materials quenching the triplet may help enhance performance and lifetime.

Development of new materials for such an organic light emitting device has been continuously required.

DISCLOSURE

Technical Problem

The present specification is directed to providing a copolymer, and an organic light emitting device including the same.

Technical Solution

One embodiment of the present specification provides a copolymer including a unit of the following Chemical Formula 1 and a unit of the following Chemical Formula 2.

[Chemical Formula 1]

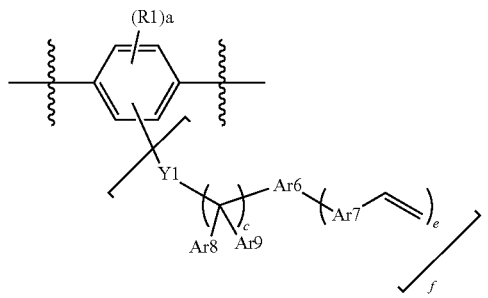

[Chemical Formula 2]

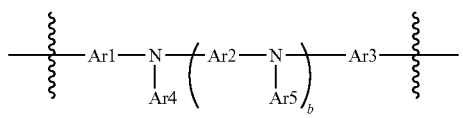

In Chemical Formulae 1 and 2,

Y1 is a direct bond or O,

R1 is hydrogen; deuterium; a halogen group; a substituted or unsubstituted alkyl group; a substituted or unsubstituted alkoxy group; a substituted or unsubstituted cycloalkyl group; a substituted or unsubstituted aryl group; or a substituted or unsubstituted heterocyclic group, Ar1 to Ar3 are the same as or different from each other, and each independently a substituted or unsubstituted arylene group; or a substituted or unsubstituted heteroarylene group, Ar4 and Ar5 are the same as or different from each other, and each independently hydrogen; deuterium; a substituted or unsubstituted alkyl group; a substituted or unsubstituted aryl group; or a substituted or unsubstituted heteroaryl group, Ar6 is a direct bond; or a substituted or unsubstituted arylene group, Ar7 is a direct bond; a substituted or unsubstituted alkylene group; a substituted or unsubstituted arylene group; or a substituted or unsubstituted heteroarylene group, Ar8 and Arg are the same as or different from each other, and each independently hydrogen; deuterium; a halogen group; a nitrile group; a substituted or unsubstituted silyl group; a substituted or unsubstituted alkoxy group; a substituted or unsubstituted aryloxy group; a substituted or unsubstituted amine group; a substituted or unsubstituted alkyl group; a substituted or unsubstituted aryl group; or a substituted or unsubstituted heteroaryl group, a is an integer of 0 to 3, b is an integer of 0 or 1, c is an integer of 1 to 10, e is an integer of 1 or 2, f is an integer of 1 or 2, when a is a plural number, R1s are the same as or different from each other, when e is 2, insides of the parentheses are the same as or different from each other, and when f is 2, insides of the parentheses are the same as or different from each other.

Another embodiment of the present specification provides a coating composition including the copolymer, or a cured material thereof.

Another embodiment of the present specification provides an organic light emitting device including a first electrode; a second electrode provided opposite to the first electrode;

and one or more organic material layers between the first electrode and the second electrode, wherein one or more layers of the organic material layers include the coating composition or a cured material thereof.

Another embodiment of the present specification provides a method for manufacturing an organic light emitting device including preparing a substrate; forming a cathode or an anode on the substrate; forming one or more organic material layers on the cathode or the anode; and forming an anode or a cathode on the organic material layer, wherein the forming of organic material layers includes forming one or more organic material layers using the coating composition.

Advantageous Effects

A hole injection layer/hole transfer layer material using a copolymer of the present disclosure has high solubility for an organic solvent, and has excellent hole transfer properties in a device after forming a film. In addition, the material is not deformed by an additional solution process after solution coating and heat treatment processes, and efficiency and a lifetime can be improved.

DESCRIPTION OF DRAWINGS

FIG. 1 is a diagram illustrating an organic light emitting device according to one embodiment of the present specification.
FIG. 2 shows LCMS data of Intermediate 4-1.
FIG. 3 shows LCMS data of Monomer 4.
FIG. 4 shows LCMS data of Monomer 5.

REFERENCE NUMERAL

1: Substrate
2: First Electrode
3: Organic Material Layer
4: Light Emitting Layer
5: Second Electrode

MODE FOR DISCLOSURE

Hereinafter, the present specification will be described in detail.

One embodiment of the present specification provides a copolymer including a unit of Chemical Formula 1 and a unit of Chemical Formula 2.

One embodiment of the present specification provides a coating composition including the copolymer, or a cured material thereof.

One embodiment of the present specification provides an organic light emitting device including a first electrode; a second electrode provided opposite to the first electrode; and one or more organic material layers between the first electrode and the second electrode, wherein one or more layers of the organic material layers include the coating composition or a cured material thereof.

One embodiment of the present specification provides a method for manufacturing an organic light emitting device including preparing a substrate; forming a cathode or an anode on the substrate; forming one or more organic material layers on the cathode or the anode; and forming an anode or a cathode on the organic material layer, wherein the forming of organic material layers includes forming one or more organic material layers using the coating composition.

In the present specification, a description of a certain part "including" certain constituents means capable of further including other constituents, and does not exclude other constituents unless particularly stated on the contrary.

In the present specification, a description of a certain member being placed "on" another member includes not only a case of the one member adjoining the another member but a case of still another member being present between the two members.

In the present specification, a "combination" means linking a number of one structure, or linking structures of different types.

Examples of substituents in the present specification are described below, however, the substituents are not limited thereto.

In the present specification,

means a site bonding to other substituents, monomers or bonding sites.

In the present specification, the monomer may mean a repeating unit included in a polymer.

The term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, the term "substituted or unsubstituted" means being substituted with one, two or more substituents selected from the group consisting of deuterium; a halogen group; a nitrile group; a nitro group; an imide group; an amide group; a carbonyl group; an ester group; a hydroxyl group; an alkyl group; cycloalkyl group; an alkoxy group; an aryloxy group; an alkylthioxy group; an arylthioxy group; an alkylsulfoxy group; an arylsulfoxy group; an alkenyl group; a silyl group; a siloxane group; a boron group; an amine group; an arylphosphine group; a phosphine oxide group; an aryl group; and a heterocyclic group, being substituted with a substituent linking two or more substituents among the substituents illustrated above, or having no substituents. For example, "a substituent linking two or more substituents" may include a biphenyl group. In other words, a biphenyl group may be an aryl group, or interpreted as a substituent linking two phenyl groups.

In the present specification, the halogen group may be fluorine, chlorine, bromine or iodine.

In the present specification, the number of carbon atoms of the carbonyl group is not particularly limited, but is preferably from 1 to 30.

In the present specification, in the ester group, the oxygen of the ester group may be substituted with a linear, branched or cyclic alkyl group having 1 to 25 carbon atoms, or an aryl group having 6 to 30 carbon atoms.

In the present specification, the alkyl group may be linear or branched, and although not particularly limited thereto, the number of carbon atoms is preferably from 1 to 30. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 4-methylhexyl, 5-methylhexyl and the like, but are not limited thereto.

In the present specification, the cycloalkyl group is not particularly limited, but preferably has 3 to 30 carbon atoms, and specific examples thereof may include cylopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl and the like, but are not limited thereto.

In the present specification, the amine group may be selected from the group consisting of —NH$_2$; an alkylamine group; an N-arylalkylamine group; an arylamine group; an N-arylheteroarylamine group; an N-alkylheteroarylamine group and a heteroarylamine group, and although not particularly limited thereto, the number of carbon atoms is preferably from 1 to 30. Specific examples of the amine group may include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, an N-phenylnaphthylamine group, a ditolylamine group, an N-phenyltolylamine group, a triphenylamine group and the like, but are not limited thereto.

In the present specification, the N-alkylarylamine group means an amine group in which N of the amine group is substituted with an alkyl group and an aryl group.

In the present specification, the N-arylheteroarylamine group means an amine group in which N of the amine group is substituted with an aryl group and a heteroaryl group.

In the present specification, the N-alkylheteroarylamine group means an amine group in which N of the amine group is substituted with an alkyl group and a heteroaryl group.

In the present specification, the alkyl group in the alkylamine group, the N-arylalkylamine group, the alkylthioxy group, the alkylsulfoxy group and the N-alkylheteroarylamine group is the same as the examples of the alkyl group described above. Specifically, the alkylthioxy group may include a methylthioxy group, an ethylthioxy group, a tert-butylthioxy group, a hexylthioxy group, an octylthioxy group and the like, and the alkylsulfoxy group may include mesyl, an ethylsulfoxy group, a propylsulfoxy group, a butylsulfoxy group and the like, however, the alkylthoixy group and the alkylsulfoxy group are not limited thereto.

In the present specification, the aryl group may be monocyclic or polycyclic.

When the aryl group is a monocyclic aryl group, the number of carbon atoms is not particularly limited, but is preferably from 6 to 30. Specific examples of the monocyclic aryl group may include a phenyl group, a biphenyl group, a terphenyl group and the like, but are not limited thereto.

When the aryl group is a polycyclic aryl group, the number of carbon atoms is not particularly limited, but is preferably from 10 to 30. Specific examples of the polycyclic aryl group may include a naphthyl group, an anthracenyl group, a phenanthryl group, a pyrenyl group, a perylenyl group, a chrysenyl group, a fluorenyl group and the like, but are not limited thereto.

In the present specification, the fluorenyl group may be substituted, and adjacent substituents may bond to each other to form a ring.

When the fluorenyl group is substituted,

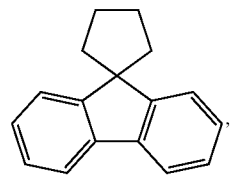 [SMILES: c1ccc2c(c1)-c1ccccc1C21CCCC1]

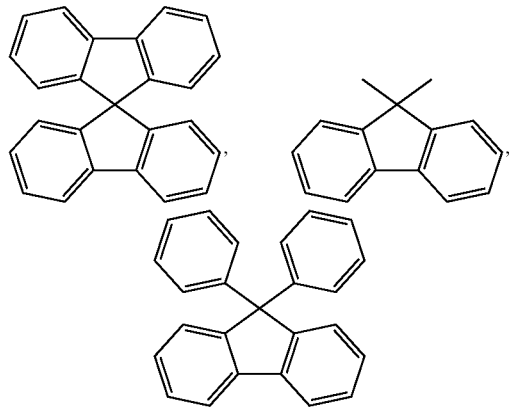

and the like may be included. However, the structure is not limited thereto.

In the present specification, the aryl group in the aryloxy group, the arylthioxy group, the arylsulfoxy group, the N-arylalkylamine group, the N-arylheteroarylamine group and the arylphosphine group is the same as the examples of the aryl group described above. Specific examples of the aryloxy group may include a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group and the like. Specific examples of the arylthioxy group may include a phenylthioxy group, a 2-methylphenylthioxy group, a 4-tert-butylphenylthioxy group and the like, and specific examples of the arylsulfoxy group may include a benzenesulfoxy group, a p-toluenesulfoxy group and the like. However, the aryloxy group, the arylthioxy group and the arylsulfoxy group are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group including two or more aryl groups may include monocyclic aryl groups, polycyclic aryl groups, or both monocyclic aryl groups and polycyclic aryl groups. For example, the aryl group in the arylamine group may be selected from among the examples of the aryl group described above.

In the present specification, the heterocyclic group is a group including one or more atoms that are not carbon, that is, heteroatoms, and specifically, the heteroatom may include one or more atoms selected from the group consisting of O, N, Se, S and the like. The number of carbon atoms is not particularly limited, but is preferably from 2 to 30, and the heterocyclic group may be monocyclic or polycyclic. Examples of the heterocyclic group may include a thiophene group, a furanyl group, a pyrrole group, an imidazolyl group, a triazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group, an isoxazolyl group, a thiadiazolyl group, a phenothiazinyl group, a dibenzofuranyl group and the like, but are not limited thereto.

In the present specification, examples of the heteroarylamine group include a substituted or unsubstituted monoheteroarylamine group, a substituted or unsubstituted diheteroarylamine group, or a substituted or unsubstituted triheteroarylamine group. The heteroarylamine group including two or more heteroaryl groups may include monocyclic heteroaryl groups, polycyclic heteroaryl groups, or both monocyclic heteroaryl groups and polycyclic heteroaryl groups. For example, the heteroaryl group in the heteroarylamine group may be selected from among the examples of the heterocyclic group described above.

In the present specification, examples of the heteroaryl group in the N-arylheteroarylamine group and the N-alkylheteroarylamine group are the same as the examples of the heterocyclic group described above.

In the present specification, the copolymer further includes a unit of the following Chemical Formula 3.

[Chemical Formula 3]

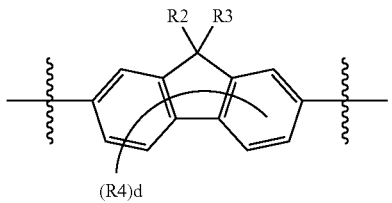

In Chemical Formula 3,

R2 and R3 are the same as or different from each other, and each independently hydrogen; deuterium; a halogen group; a substituted or unsubstituted alkyl group; a substituted or unsubstituted cycloalkyl group; a substituted or unsubstituted aryl group; or a substituted or unsubstituted heterocyclic group, R4 is hydrogen; deuterium; a halogen group; or a substituted or unsubstituted alkyl group, d is from 0 to 6, when d is a plural number, R4s are the same as or different from each other.

In one embodiment of the present specification, Y1 is a direct bond or O.

In one embodiment of the present specification, R1 and R4 are hydrogen.

In one embodiment of the present specification, R2 and R3 are the same as or different from each other, and each independently hydrogen; a substituted or unsubstituted alkyl group; a substituted or unsubstituted cycloalkyl group; a substituted or unsubstituted aryl group; or a substituted or unsubstituted heterocyclic group.

In one embodiment of the present specification, R2 and R3 are the same as or different from each other, and each independently hydrogen; a substituted or unsubstituted alkyl group; a substituted or unsubstituted aryl group; or a substituted or unsubstituted heterocyclic group.

In one embodiment of the present specification, R2 and R3 are the same as or different from each other, and each independently a substituted or unsubstituted alkyl group having 1 to 20 carbon atoms.

In one embodiment of the present specification, R2 and R3 are the same as or different from each other, and each independently an alkyl group having 1 to 20 carbon atoms.

In one embodiment of the present specification, R2 and R3 are the same as or different from each other, and each independently an alkyl group having 1 to 10 carbon atoms.

In one embodiment of the present specification, An to Ar3 are the same as or different from each other, and each independently a substituted or unsubstituted monocyclic arylene group; a substituted or unsubstituted polycyclic arylene group; or a substituted or unsubstituted heteroarylene group.

In one embodiment of the present specification, An to Ar3 are the same as or different from each other, and each independently a substituted or unsubstituted monocyclic arylene group having 6 to 20 carbon atoms; a substituted or unsubstituted polycyclic arylene group having 10 to 20 carbon atoms; or a substituted or unsubstituted heteroarylene group having 3 to 20 carbon atoms.

In one embodiment of the present specification, An to Ar3 are the same as or different from each other, and each independently a substituted or unsubstituted phenylene group; a substituted or unsubstituted biphenylenylene group; a substituted or unsubstituted naphthalene group; a substituted or unsubstituted terphenylenylene group; a substituted or unsubstituted anthracenylene group; a substituted or unsubstituted phenanthrenylene group; a substituted or unsubstituted fluorenylene group; or a substituted or unsubstituted pyrenylene group.

In one embodiment of the present specification, An to Ar3 are a phenylene group.

In one embodiment of the present specification, Ar4 and Ar5 are the same as or different from each other, and each independently hydrogen; a substituted or unsubstituted alkyl group; a substituted or unsubstituted aryl group; or a substituted or unsubstituted heteroaryl group.

In one embodiment of the present specification, Ar4 and Ar5 are the same as or different from each other, and each independently hydrogen; a substituted or unsubstituted alkyl group; a substituted or unsubstituted monocyclic aryl group; a substituted or unsubstituted polycyclic aryl group; or a substituted or unsubstituted heteroaryl group.

In one embodiment of the present specification, Ar4 and Ar5 are the same as or different from each other, and each independently hydrogen; a substituted or unsubstituted alkyl group; a substituted or unsubstituted monocyclic aryl group having 6 to 20 carbon atoms; a substituted or unsubstituted polycyclic aryl group having 10 to 20 carbon atoms; or a substituted or unsubstituted heteroaryl group having 3 to 20 carbon atoms.

In one embodiment of the present specification, Ar4 and Ar5 are the same as or different from each other, and each independently a phenyl group unsubstituted or substituted with an arylamine group or a heteroarylamine group unsubstituted or substituted with an alkyl group.

In one embodiment of the present specification, Ar4 and Ar5 are the same as or different from each other, and each independently a phenyl group unsubstituted or substituted with an alkyl group; or a phenyl group unsubstituted or substituted with an arylamine group unsubstituted or substituted with an alkyl group.

In one embodiment of the present specification, Ar4 and Ar5 are the same as or different from each other, and each independently a phenyl group unsubstituted or substituted with an alkyl group.

In one embodiment of the present specification, Ar6 is a direct bond; or a substituted or unsubstituted monocyclic or polycyclic arylene group.

In one embodiment of the present specification, Ar6 is a direct bond; or a substituted or unsubstituted monocyclic arylene group having 6 to 20 carbon atoms.

In one embodiment of the present specification, Ar6 is a direct bond; or a substituted or unsubstituted polycyclic arylene group having 10 to 20 carbon atoms.

In one embodiment of the present specification, Ar6 is a direct bond; a substituted or unsubstituted phenylene group; a substituted or unsubstituted biphenylenylene group; a substituted or unsubstituted naphthalene group; a substituted or unsubstituted terphenylenylene group; a substituted or unsubstituted anthracenylene group; a substituted or unsubstituted phenanthrenylene group; a substituted or unsubstituted fluorenylene group; or a substituted or unsubstituted pyrenylene group.

In one embodiment of the present specification, Ar6 is a direct bond; a phenylene group; or a fluorenylene group.

In one embodiment of the present specification, Ar7 is a direct bond; a substituted or unsubstituted monocyclic arylene group; a substituted or unsubstituted polycyclic arylene group; or a substituted or unsubstituted heteroarylene group.

In one embodiment of the present specification, Ar7 is a direct bond; a substituted or unsubstituted monocyclic arylene group having 6 to 20 carbon atoms; a substituted or unsubstituted polycyclic arylene group having 10 to 20 carbon atoms; or a substituted or unsubstituted heteroarylene group.

In one embodiment of the present specification, Ar7 is a substituted or unsubstituted monocyclic arylene group having 6 to 20 carbon atoms; or a substituted or unsubstituted polycyclic arylene group having 10 to 20 carbon atoms.

In one embodiment of the present specification, Ar7 is a substituted or unsubstituted phenylene group; or a substituted or unsubstituted fluorenylene group.

In one embodiment of the present specification, Ar7 is a phenylene group unsubstituted or substituted with an alkyl group or a halogen group; or a fluorenylene group unsubstituted or substituted with an alkyl group or an aryl group.

In one embodiment of the present specification, Ar7 is a phenylene group unsubstituted or substituted with an alkyl group having 1 to 10 carbon atoms or a halogen group; or a fluorenylene group unsubstituted or substituted with an alkyl group having 1 to 10 carbon atoms or an aryl group having 6 to 20 carbon atoms.

In one embodiment of the present specification, Ar7 is a phenylene group unsubstituted or substituted with a methyl group, an ethyl group, a propyl group, an isopropyl group, a butyl group, an n-butyl group, a tert-butyl group, a pentyl group, a hexyl group, a heptyl group, an octyl group, a nonyl group, a decyl group, F, Cl, Br or I; or a fluorenylene group unsubstituted or substituted with a methyl group, an ethyl group, a propyl group, a phenyl group, a biphenyl group, a terphenyl group, a naphthalene group, an anthracene group or a phenanthrene group.

In one embodiment of the present specification, Ar7 is a phenylene group unsubstituted or substituted with a methyl group or F; or a fluorenylene group unsubstituted or substituted with a methyl group or a phenyl group.

In one embodiment of the present specification, Ar7 is a substituted or unsubstituted N, O or S-containing heteroarylene group.

In one embodiment of the present specification, Ar7 is a substituted or unsubstituted monocyclic N, O or S-containing heteroarylene group.

In one embodiment of the present specification, Ar7 is a substituted or unsubstituted polycyclic N, O or S-containing heteroarylene group.

In one embodiment of the present specification, Ar7 is a substituted or unsubstituted monocyclic or polycyclic N, O or S-containing heteroarylene group having 2 to 30 carbon atoms.

In one embodiment of the present specification, Ar7 is a substituted or unsubstituted pyrrole group, a substituted or unsubstituted pyridine group, a substituted or unsubstituted pyrimidine group, a substituted or unsubstituted triazine group, a substituted or unsubstituted furan group, a substituted or unsubstituted thiophene group, a substituted or unsubstituted carbazole group, a substituted or unsubstituted dibenzofuran group, or a substituted or unsubstituted dibenzothiophene group.

In one embodiment of the present specification, Ar7 is a pyrrole group unsubstituted or substituted with an aryl group, a furan group unsubstituted or substituted with an aryl group, or a thiophene group unsubstituted or substituted with an aryl group.

In one embodiment of the present specification, Ar7 is a pyrrole group unsubstituted or substituted with a monocyclic aryl group having 6 to 20 carbon atoms, a furan group or a thiophene group.

In one embodiment of the present specification, Ar7 is a pyrrole group unsubstituted or substituted with a phenyl group, a furan group or a thiophene group.

In one embodiment of the present specification, Ar8 and Ar9 are the same as or different from each other, and each independently hydrogen; deuterium; a halogen group; a nitrile group; a substituted or unsubstituted silyl group; a substituted or unsubstituted amine group; a substituted or unsubstituted alkyl group; a substituted or unsubstituted aryl group; or a substituted or unsubstituted heteroaryl group.

In one embodiment of the present specification, Ar8 and Ar9 are the same as or different from each other, and each independently hydrogen; a substituted or unsubstituted alkyl group; a substituted or unsubstituted aryl group; or a substituted or unsubstituted heteroaryl group.

In one embodiment of the present specification, Ar8 and Ar9 are hydrogen.

In one embodiment of the present specification, Chemical Formula 1 may be any one of the following structural formulae.

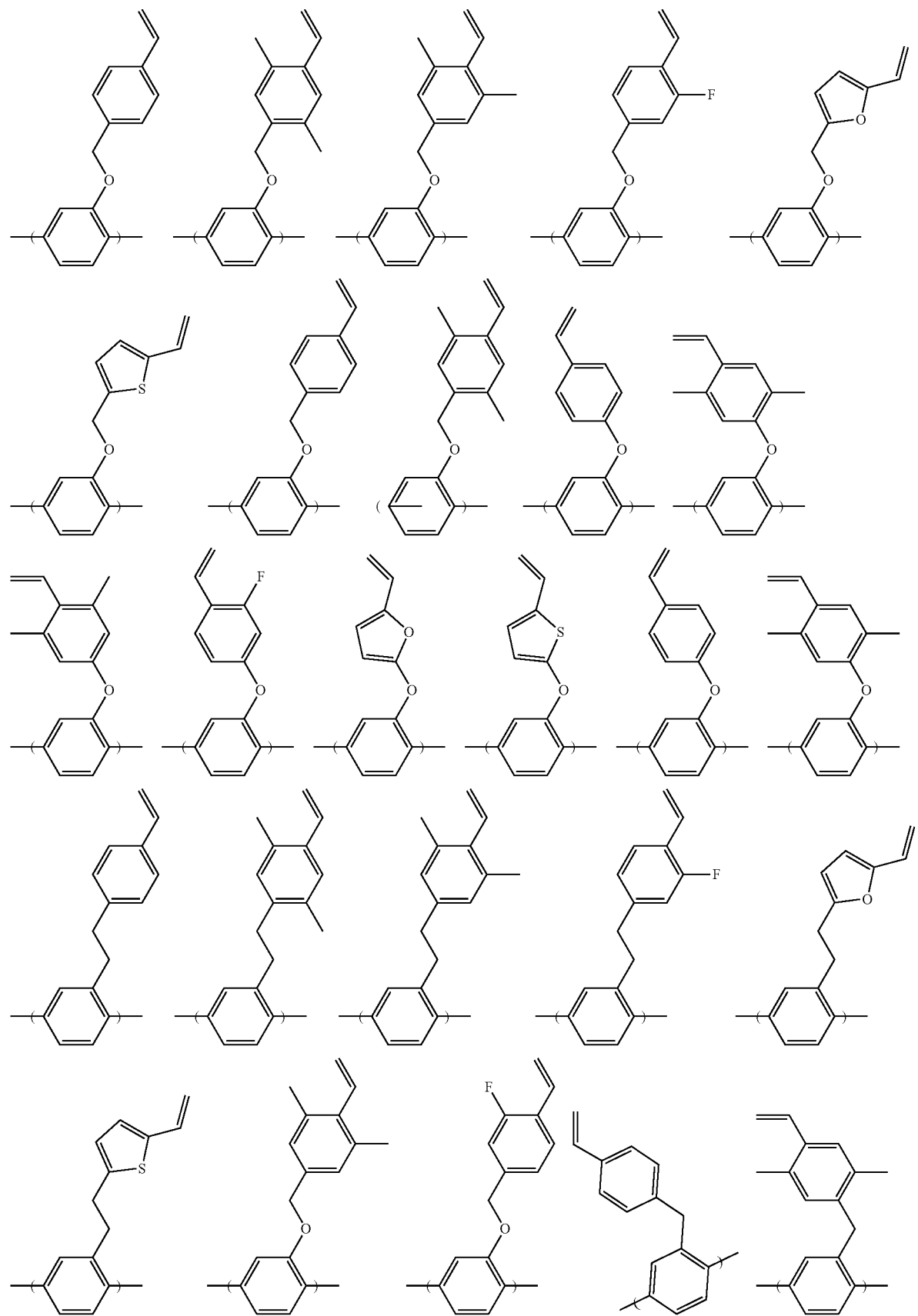

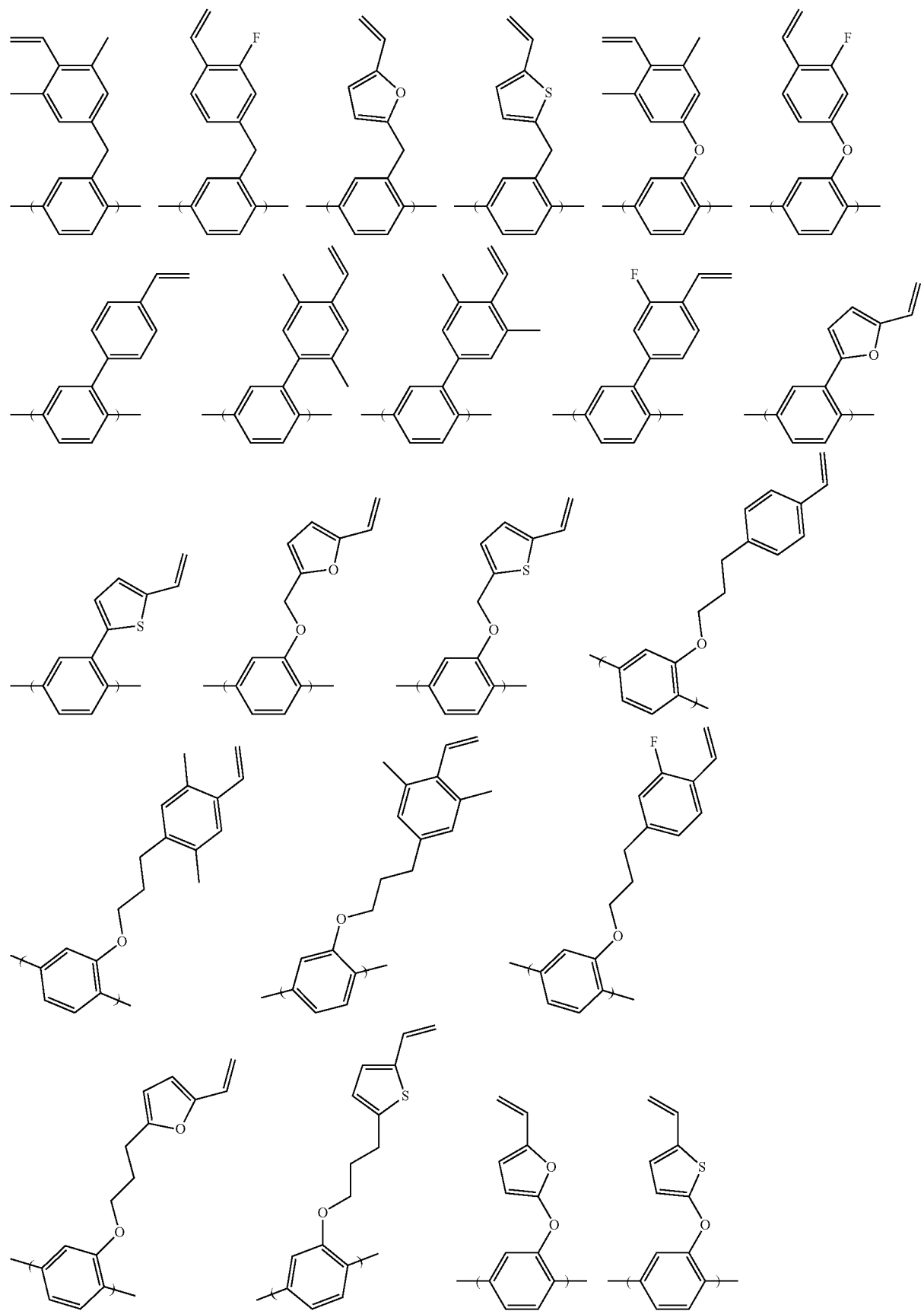

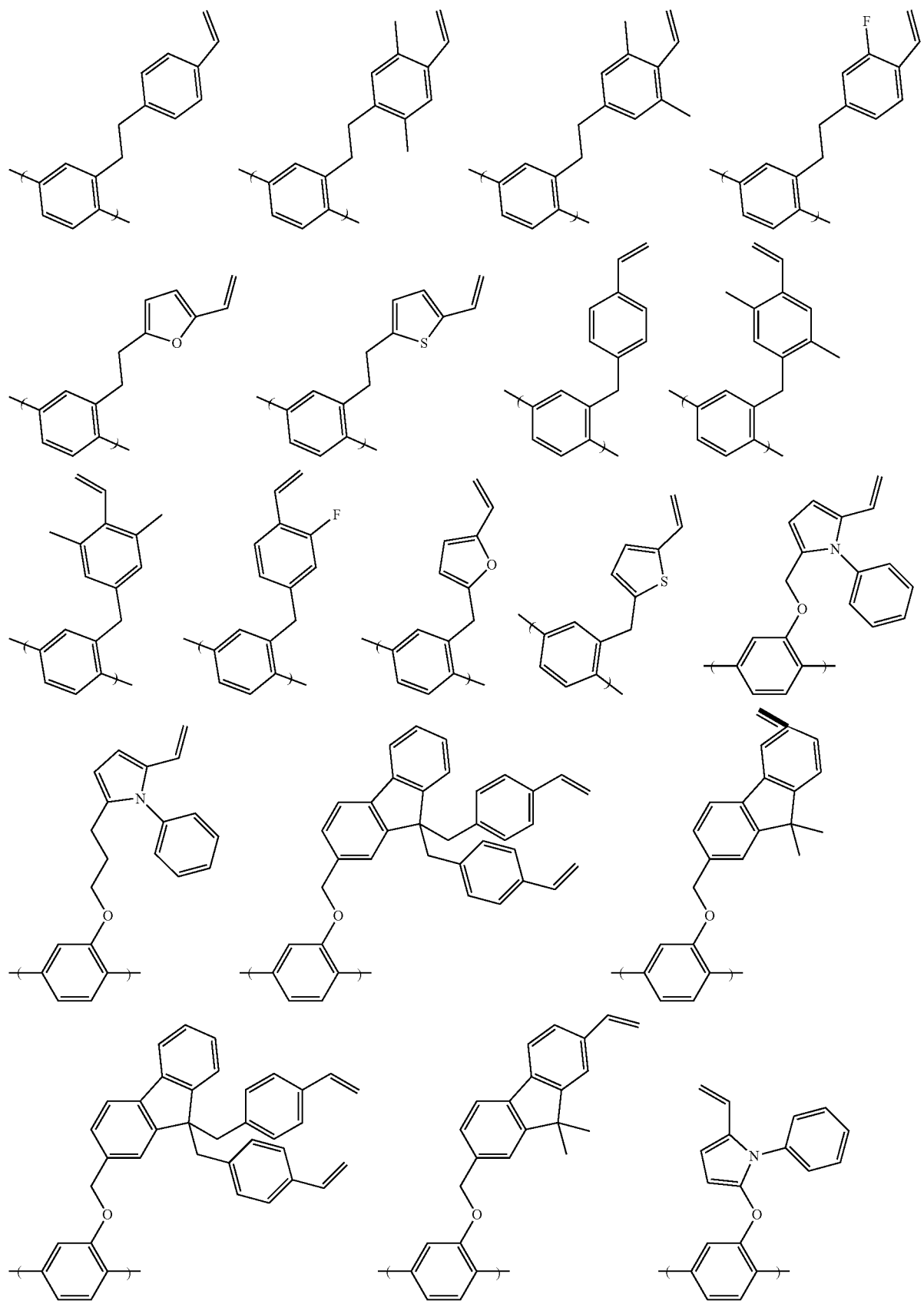

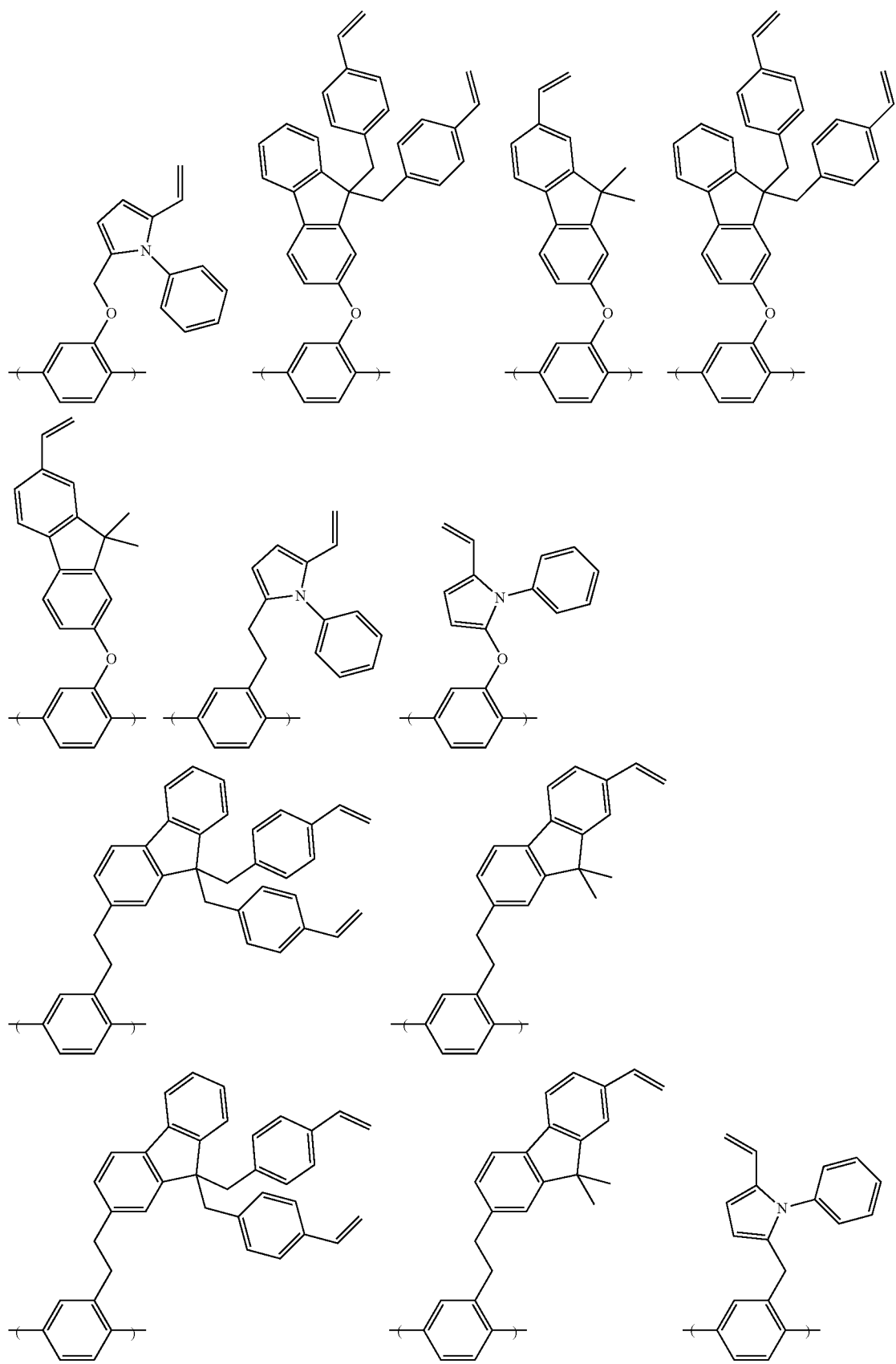

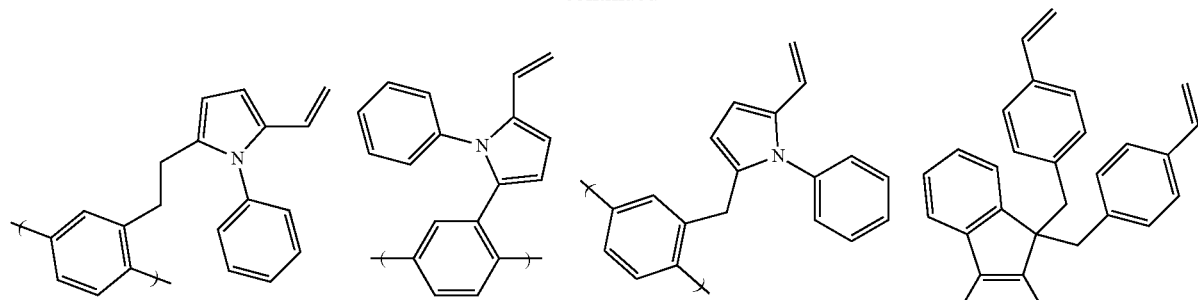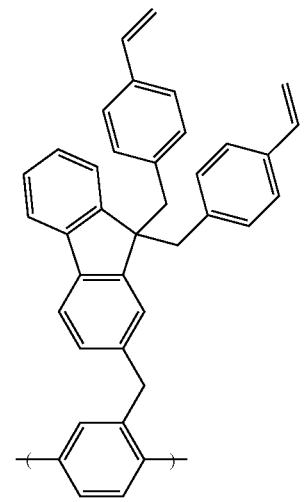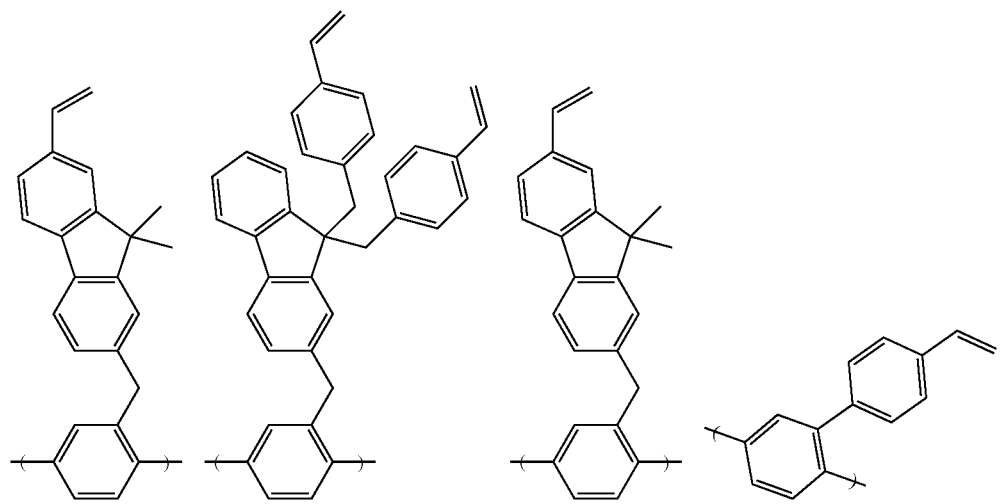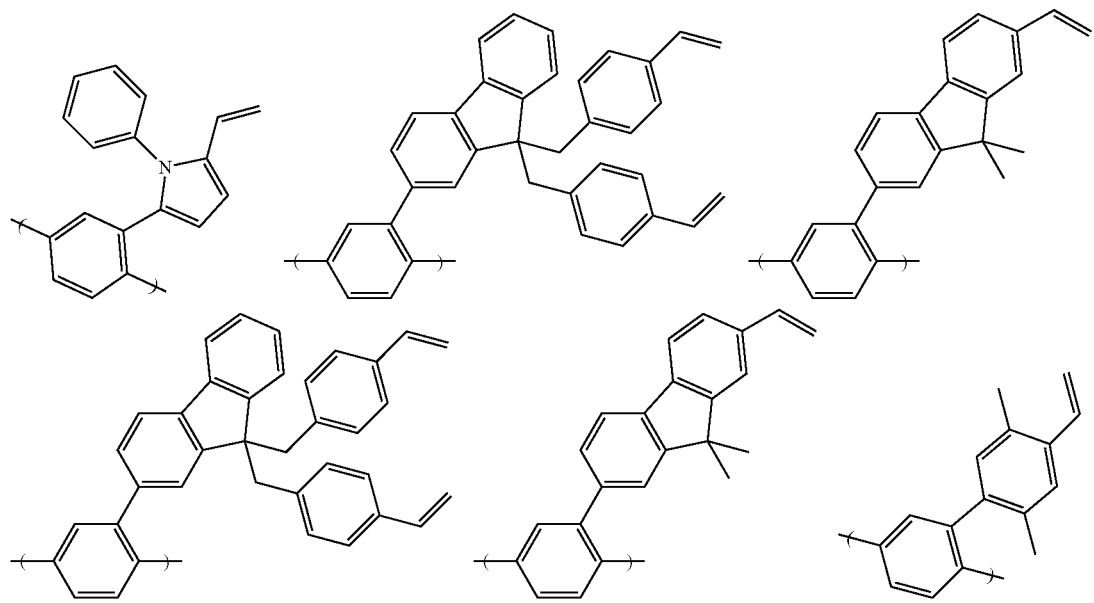

-continued
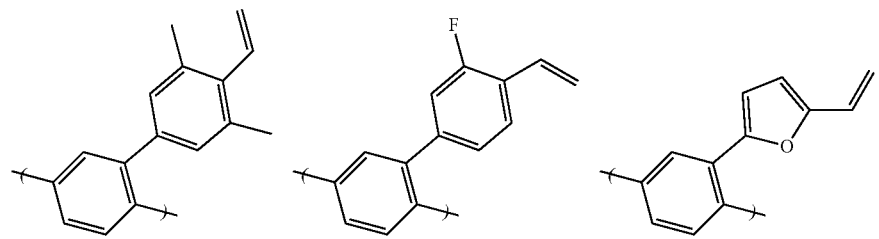
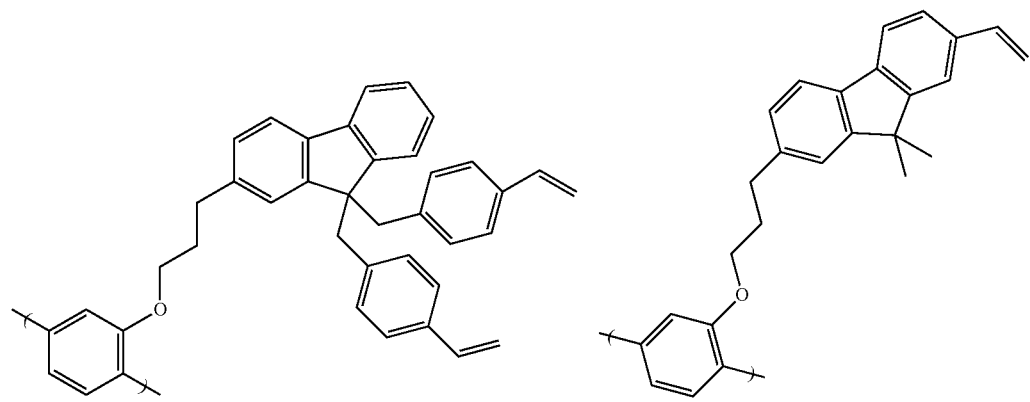
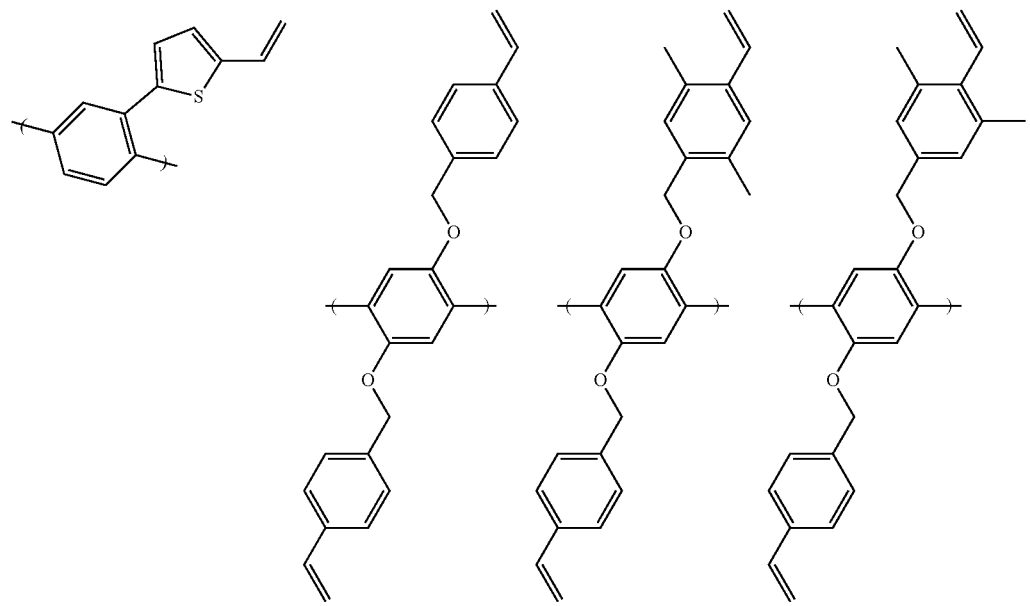

-continued
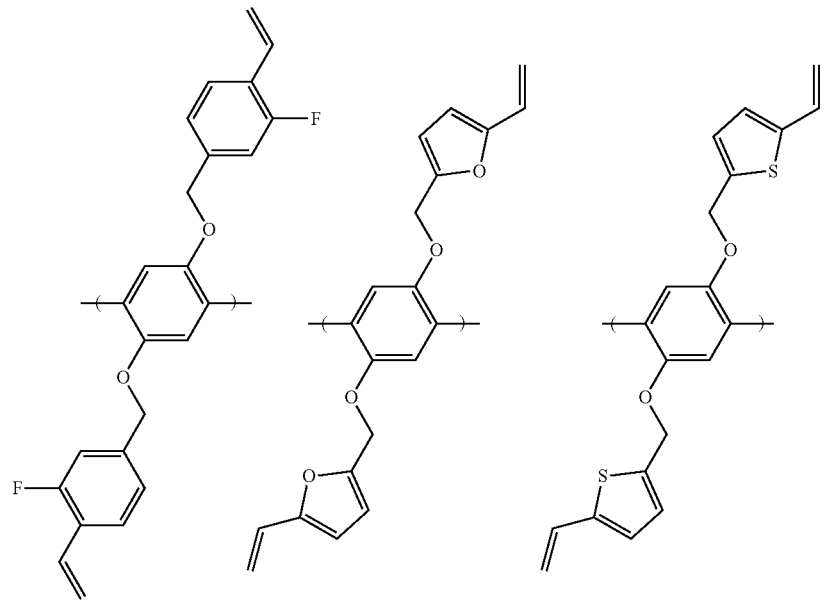
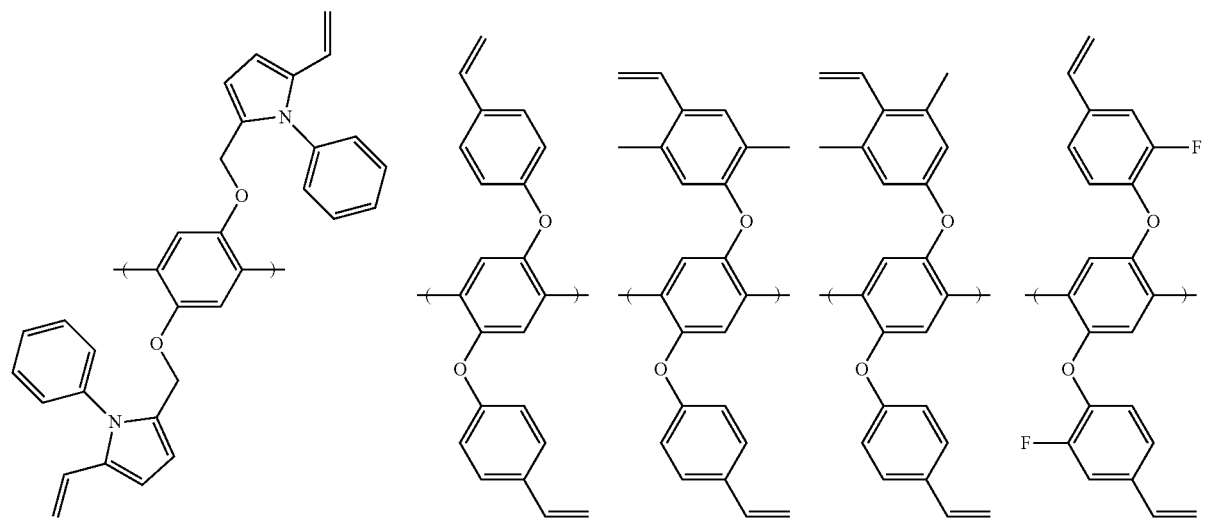

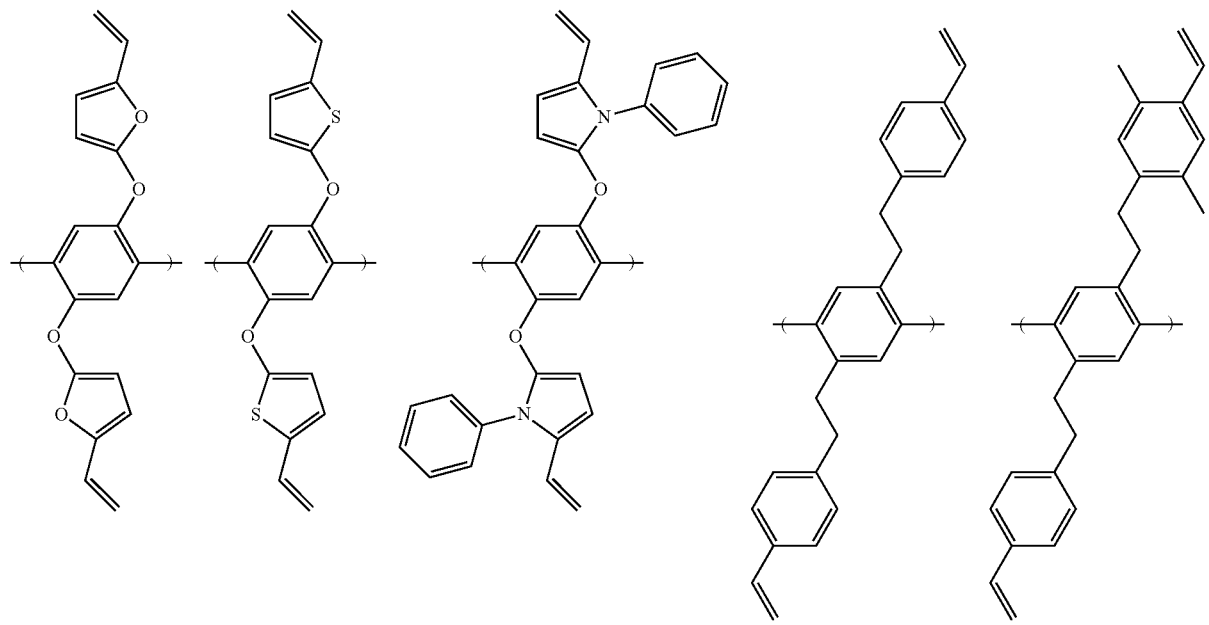
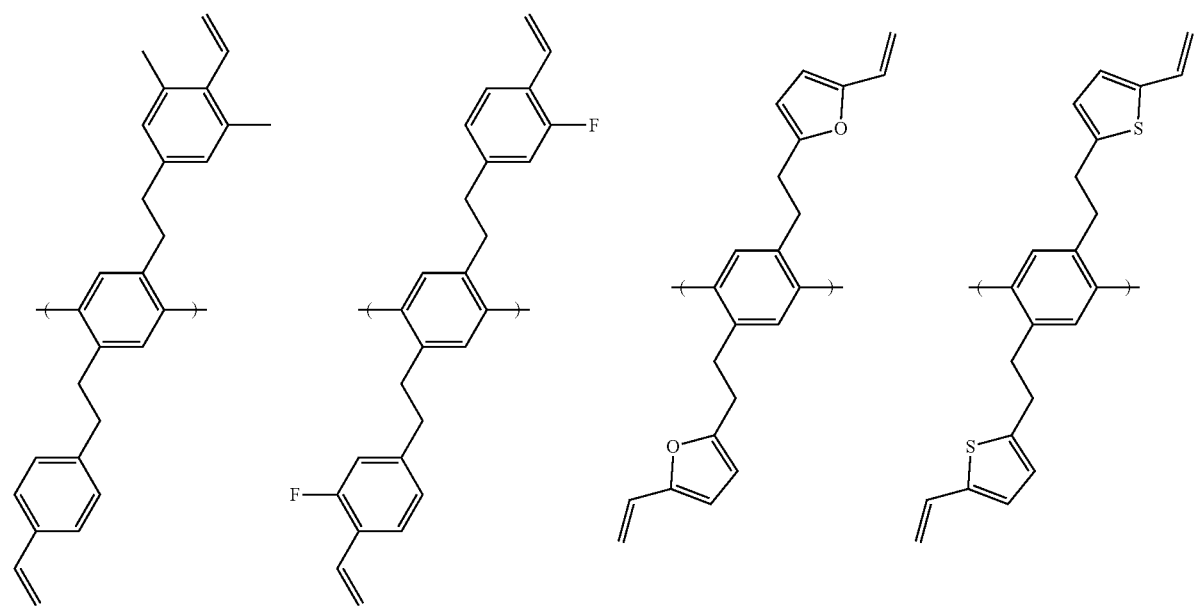

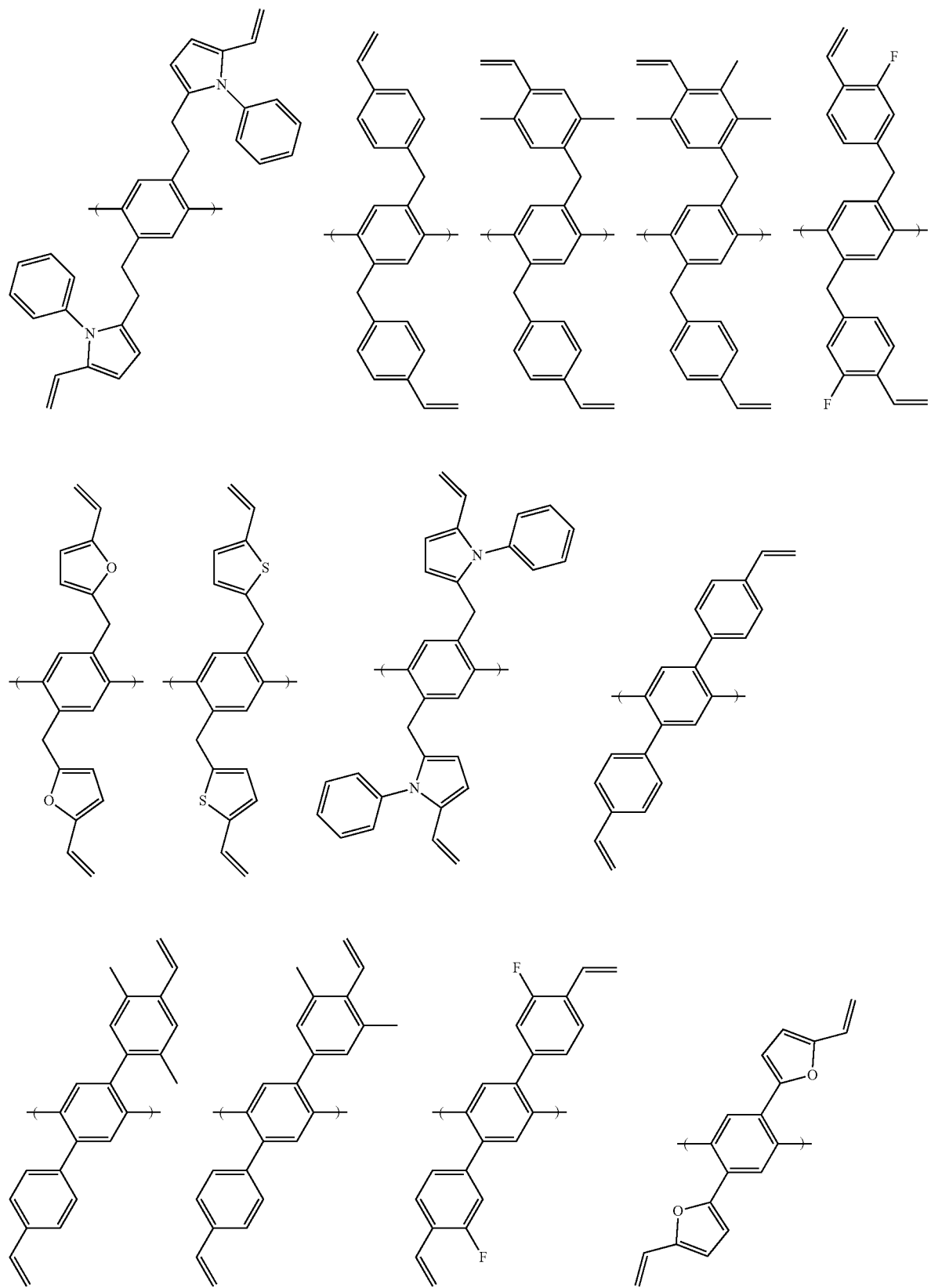

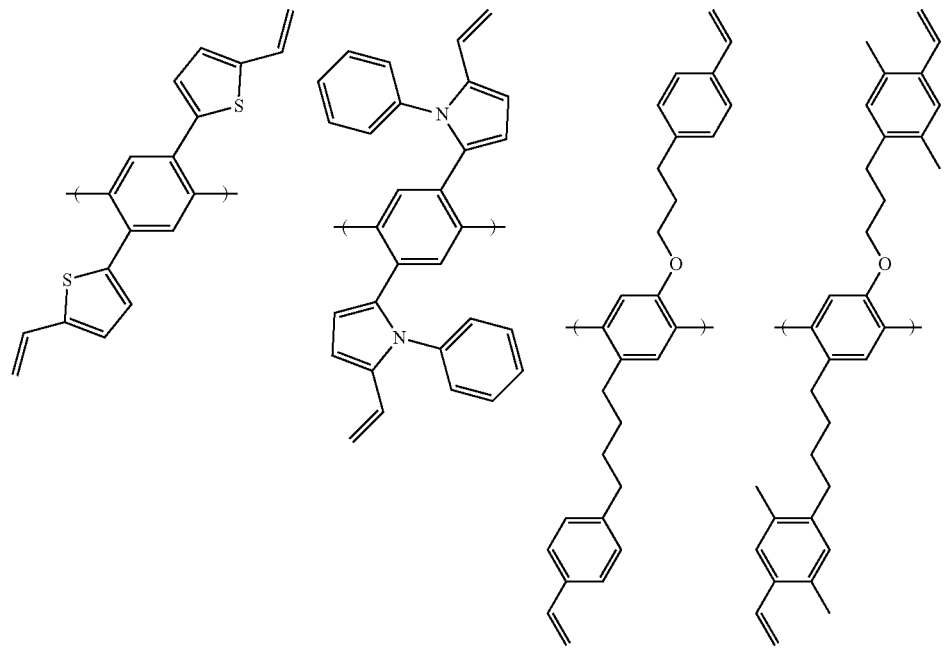
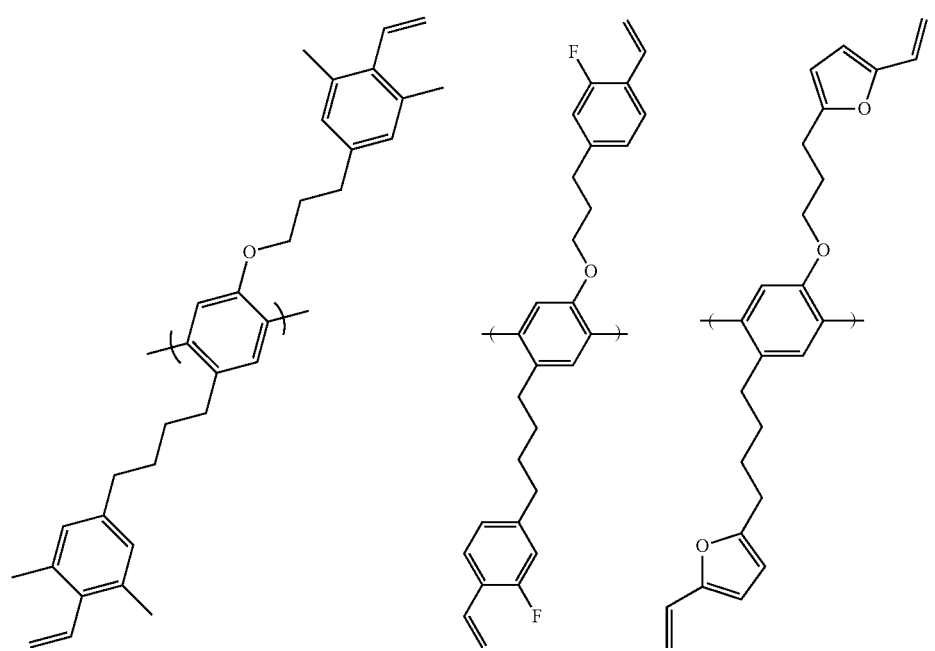

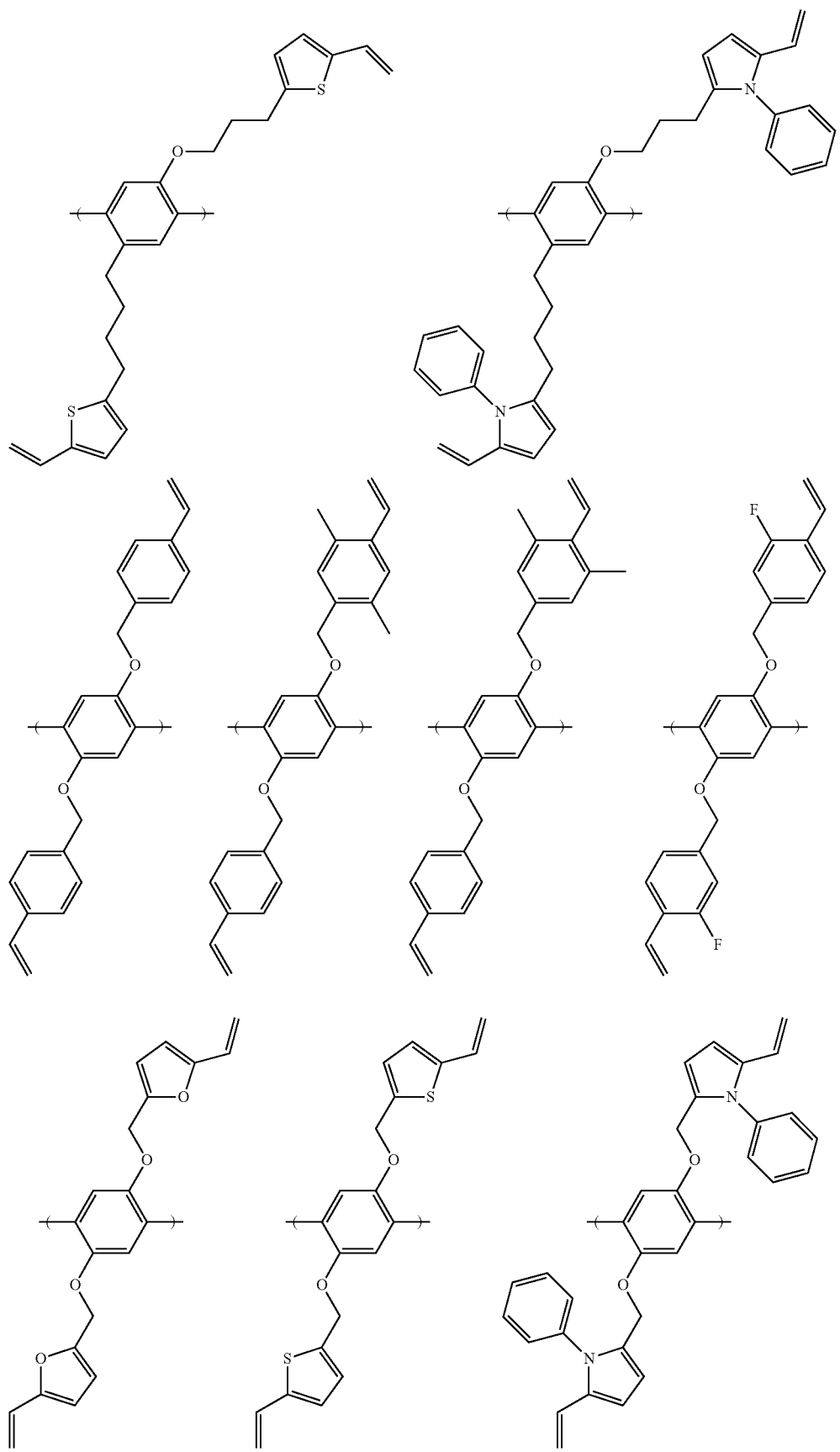

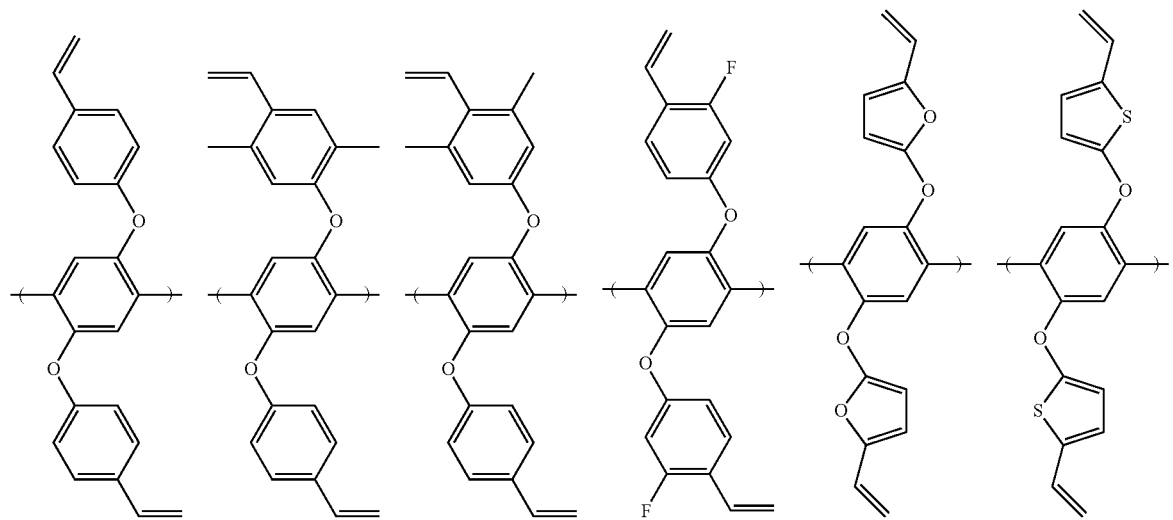
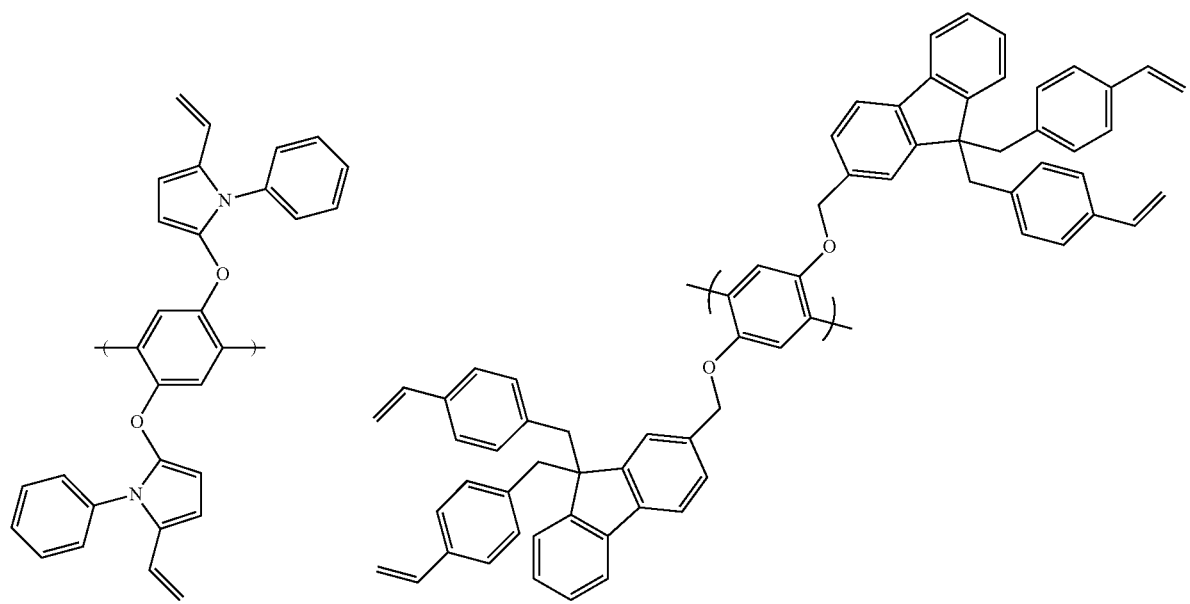

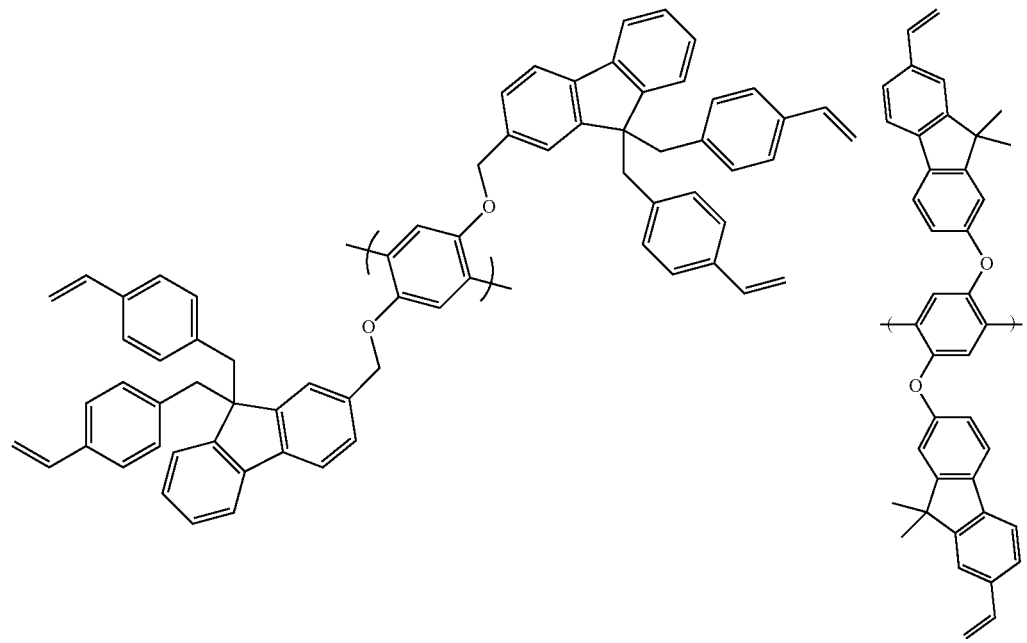
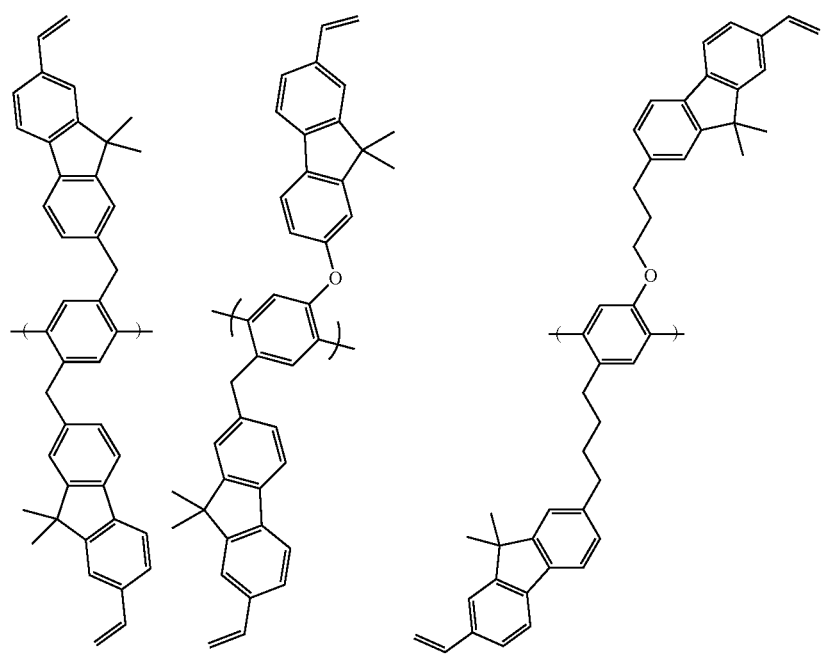

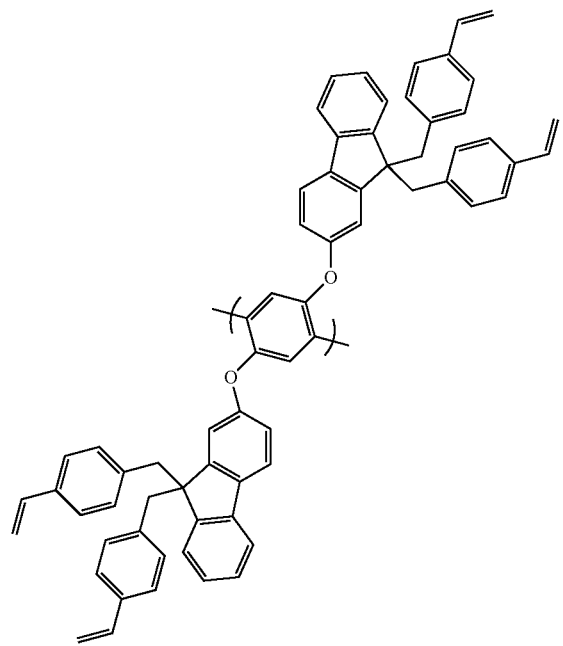
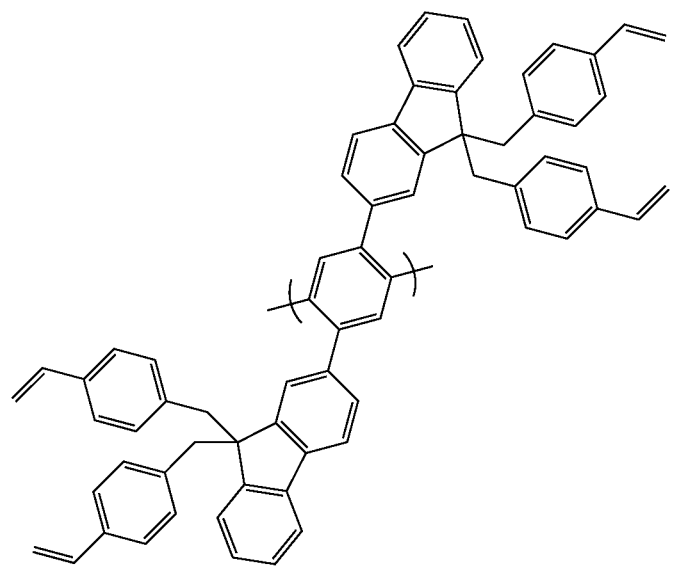

-continued
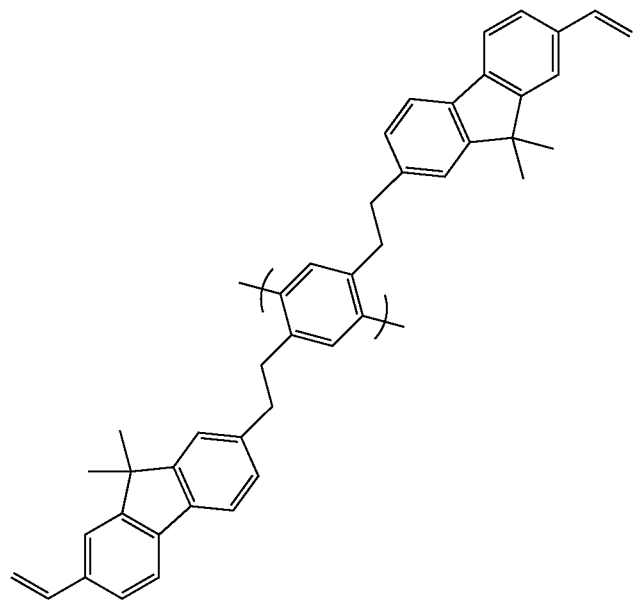
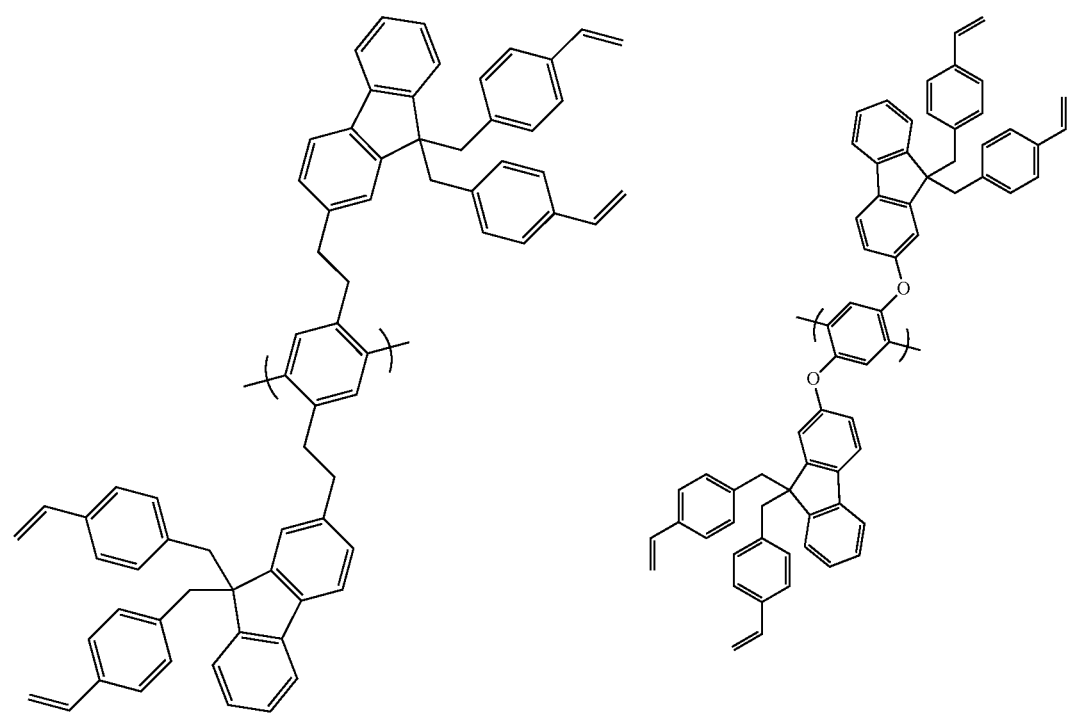

-continued
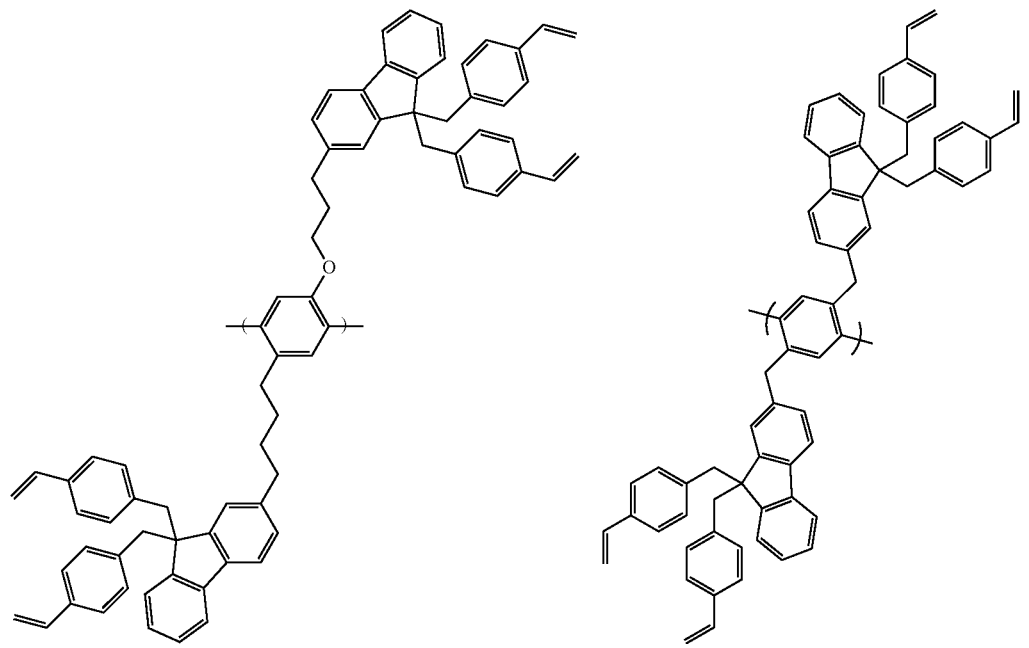
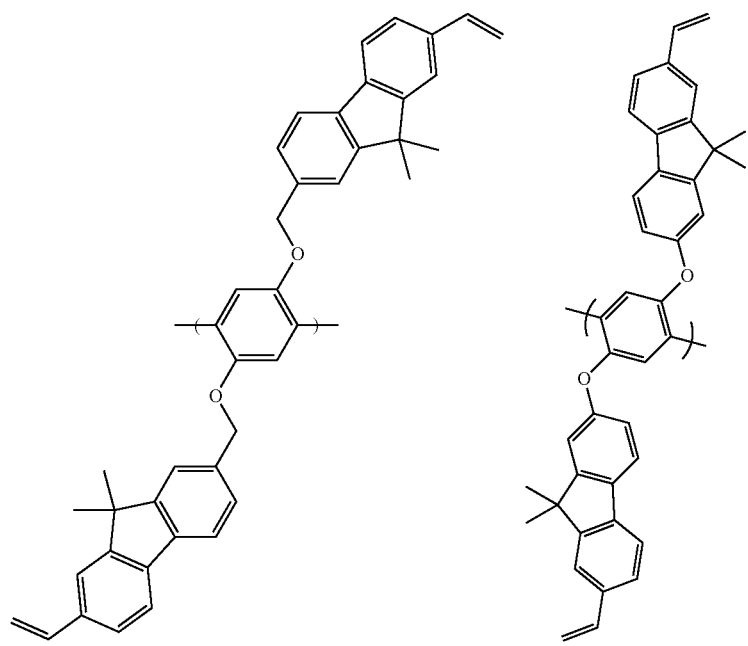

-continued
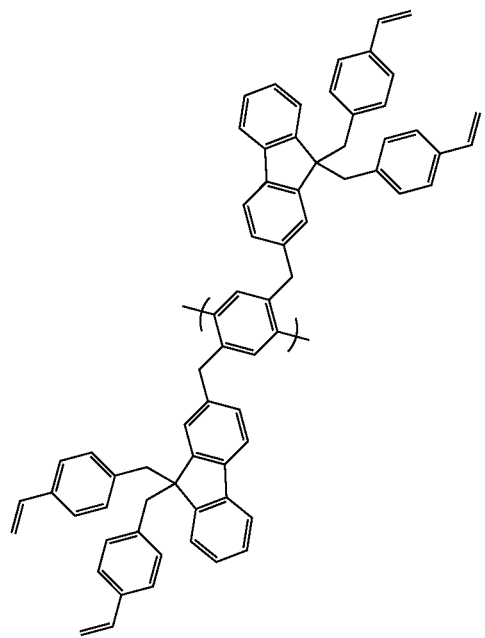
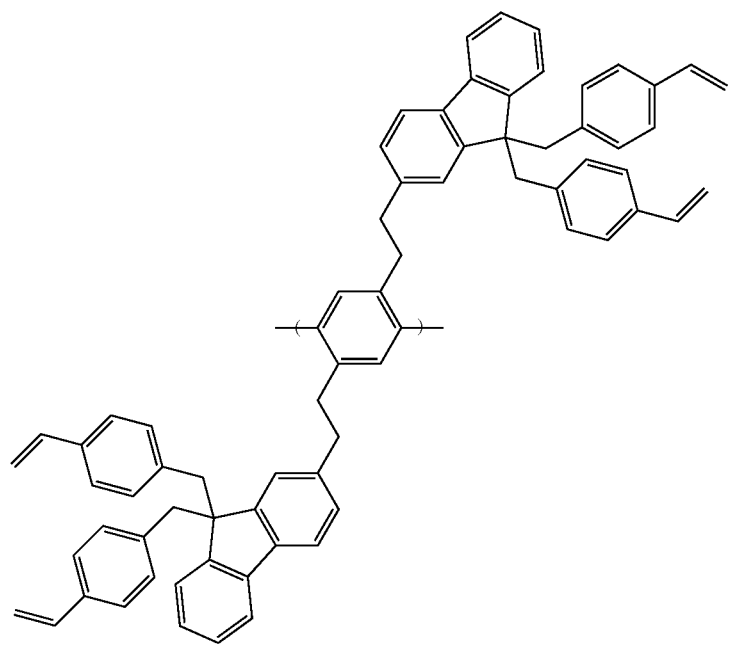

-continued
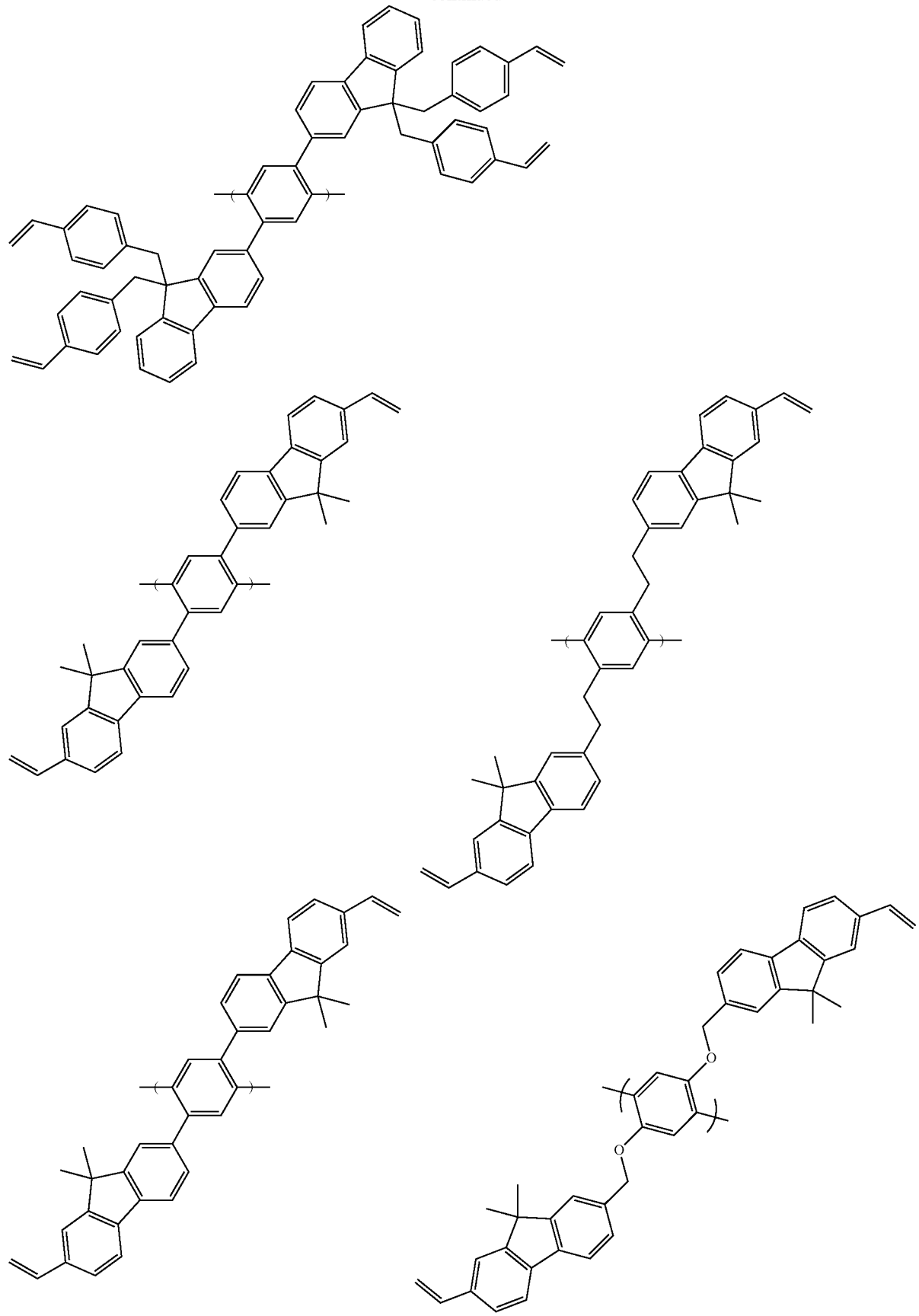

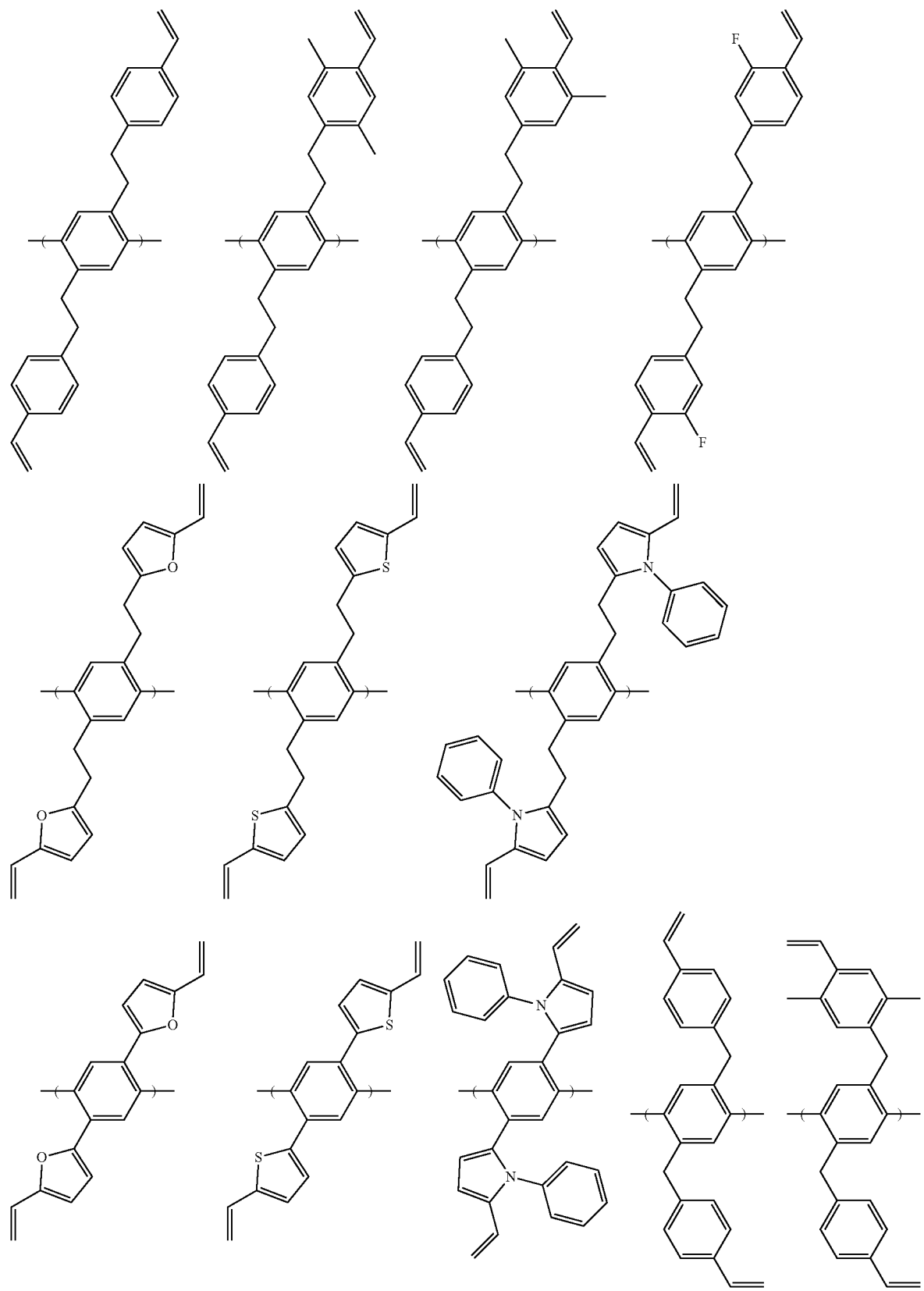

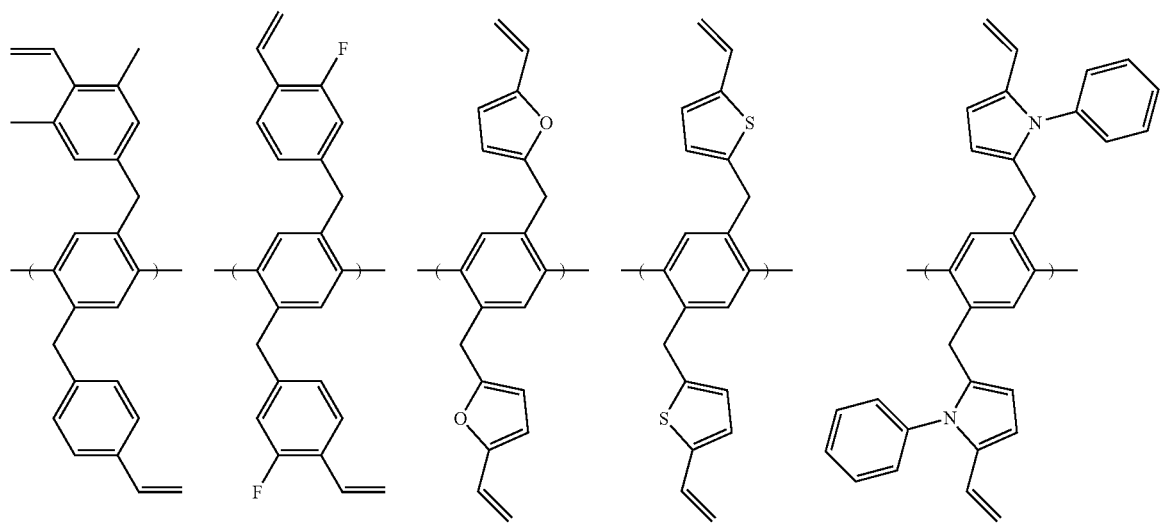

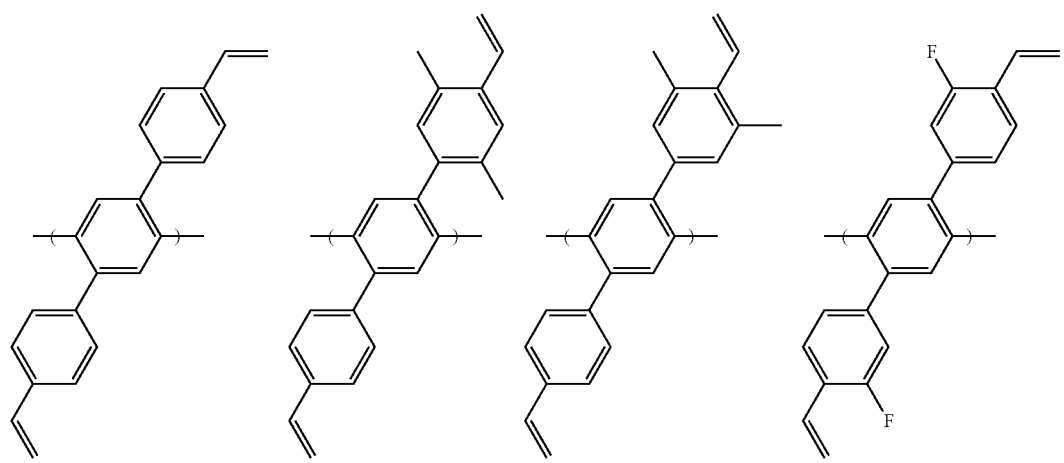

According to one embodiment of the present specification, the copolymer includes one, two or more of units represented by the following Chemical Formula 1-1 or Chemical Formula 1-2.

[Chemical Formula 1-1]

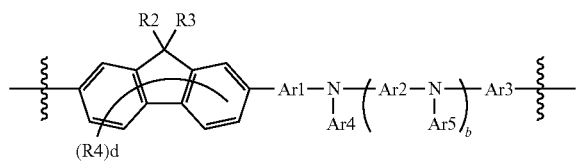

[Chemical Formula 1-2]

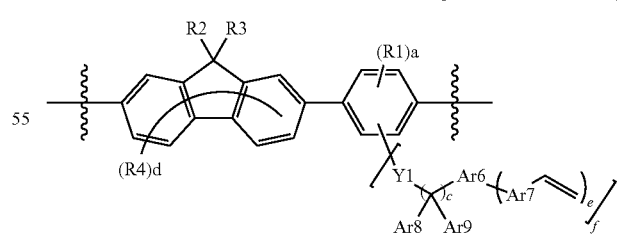

In Chemical Formulae 1-1 and 1-2,

R1 to R4, Ar1 to Ar9, Y1, and a to f have the same definitions as in Chemical Formulae 1 to 3.

According to one embodiment of the present specification, the copolymer includes a structure represented by the following Chemical Formula 1-3.

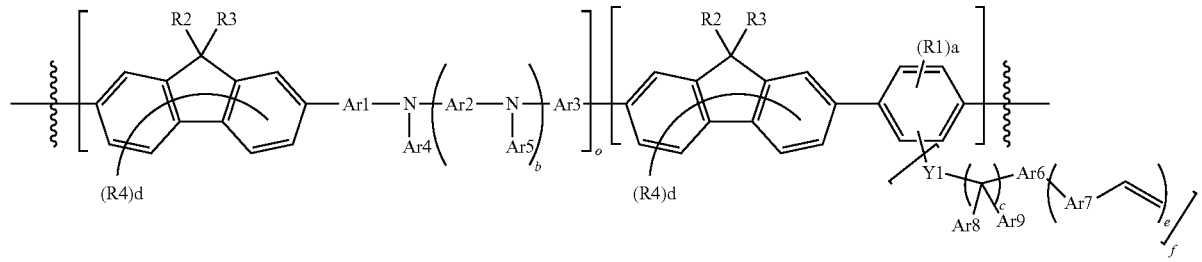
In Chemical Formula 1-3,
R1 to R4, Ar1 to Ar9, Y1, and a to f have the same definitions as in Chemical Formulae 1 to 3,
o and p are a molar ratio of each represented unit, and based on o+p=1,
o is a molar ratio of 0.05 to 0.95, and
p is a molar ratio of 0.05 to 0.95.
According to one embodiment of the present specification, the copolymer includes a structure represented by the following structural formulae.
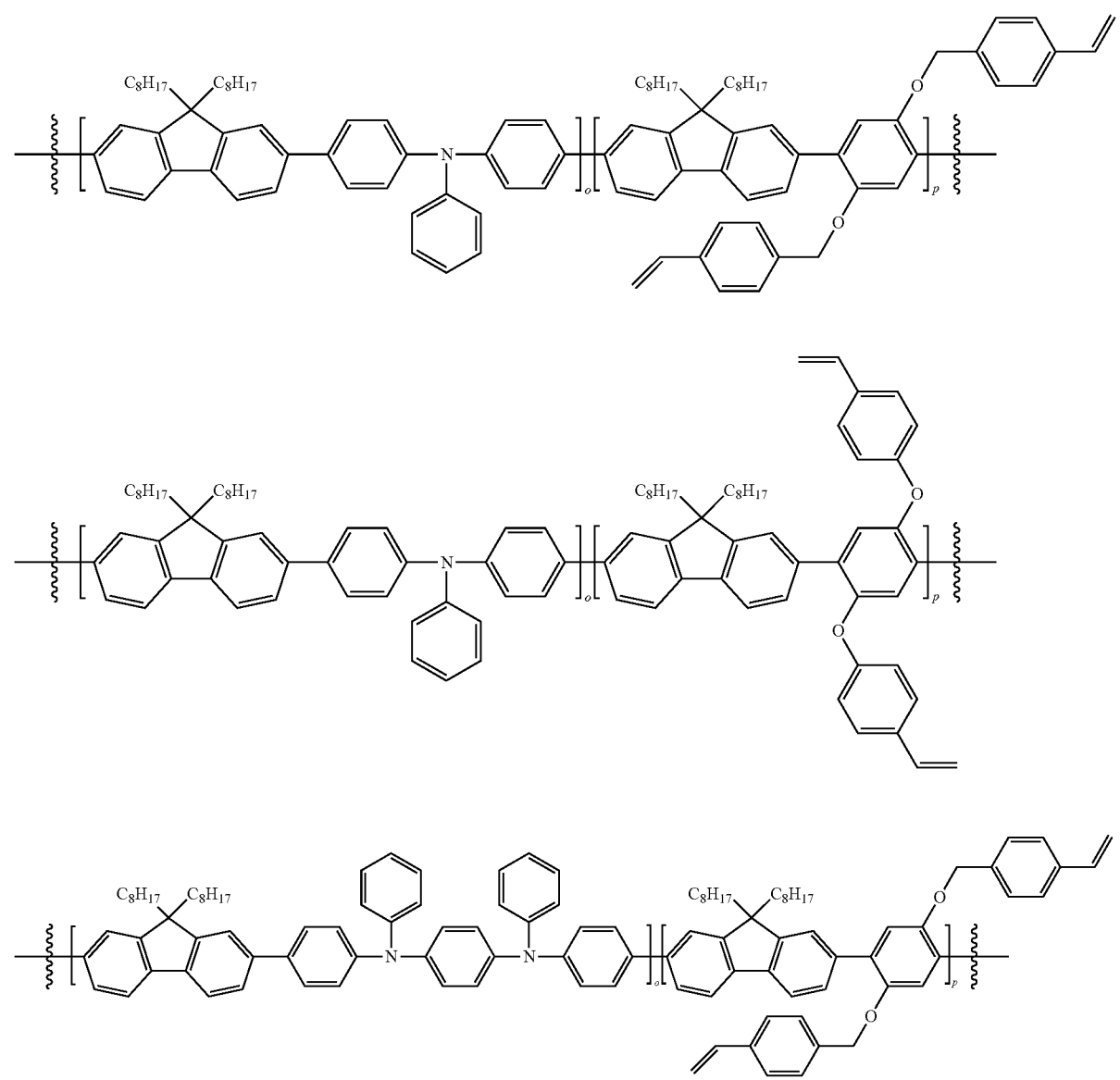

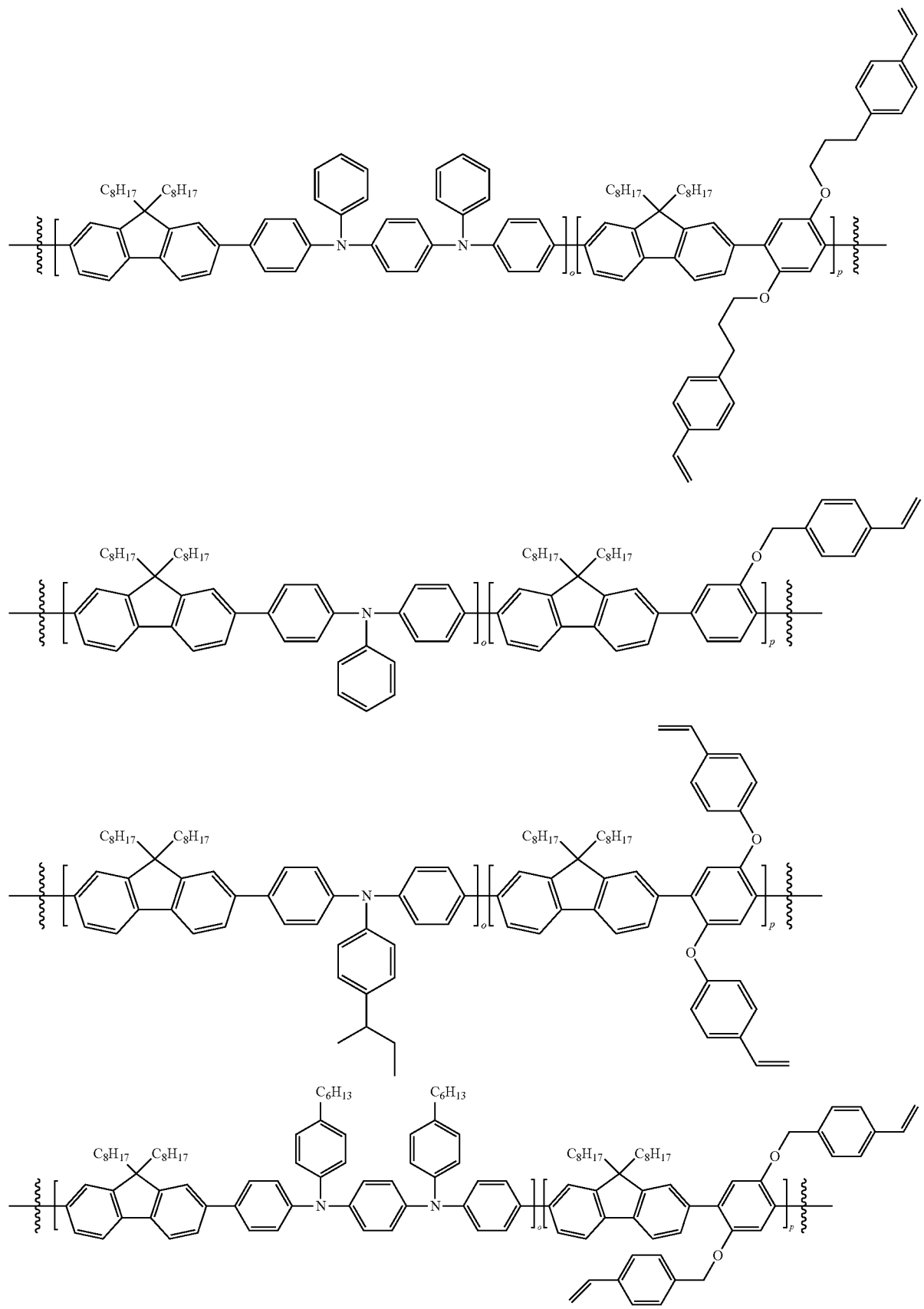

-continued

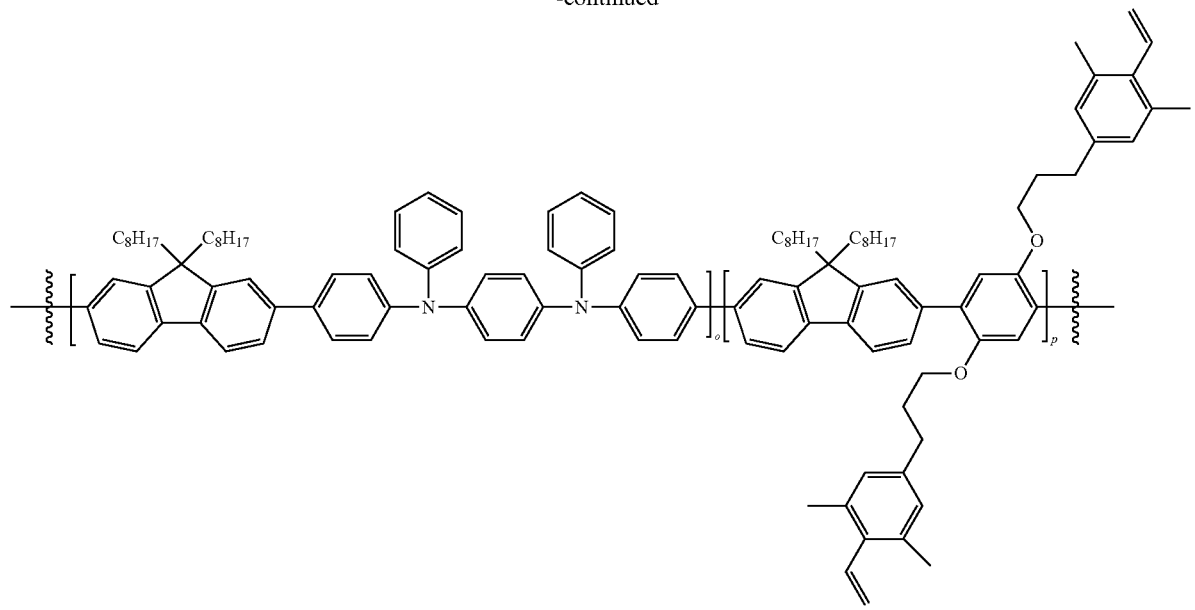

In the structural formulae, o and p are a molar ratio of each represented unit, and based on o+p=1, o is a molar ratio of 0.05 to 0.95, and p is a molar ratio of 0.05 to 0.95.

According to one embodiment of the present specification, o is a molar ratio of 0.1 to 0.5, and p is a molar ratio of 0.5 to 0.9.

According to one embodiment of the present specification, o is a molar ratio of 0.1 to 0.4, and p is a molar ratio of 0.6 to 0.9.

According to one embodiment of the present specification, the copolymer has a number average molecular weight of 100 g/mol to 10,000,000 g/mol.

According to one embodiment of the present specification, the copolymer has a number average molecular weight of 1,000 g/mol to 1,000,000 g/mol.

According to one embodiment of the present specification, an end group of the copolymer may be hydrogen or an alkyl group.

According to one embodiment of the present specification, the coating composition includes the copolymer.

According to one embodiment of the present specification, the coating composition includes the copolymer in a range of 1% by weight to 10% by weight.

The organic light emitting device of the present specification may be manufactured using materials and methods known in the art except that one or more layers of the organic material layers are formed using the coating composition including the copolymer.

For example, a structure of the organic light emitting device of the present disclosure may have a structure as illustrated in FIG. 1, however, the structure is not limited thereto.

FIG. 1 illustrates a structure of the organic light emitting device in which a first electrode (2), an organic material layer (3), a light emitting layer (4) and a second electrode (5) are consecutively laminated on a substrate (1).

In one embodiment of the present disclosure, the organic light emitting device includes a first electrode; a second electrode provided opposite to the first electrode; and one or more organic material layers between the first electrode and the second electrode, wherein one or more layers of the organic material layers include the coating composition or a cured material thereof.

In one embodiment of the present disclosure, the organic material layer includes a hole transfer layer, a hole injection layer, or a layer carrying out hole transfer and hole injection at the same time, and the hole transfer layer, the hole injection layer, or the layer carrying out hole transfer and hole injection at the same time includes the coating composition or a cured material thereof.

In one embodiment of the present disclosure, the coating composition and a cured material thereof may be included in an electron injection layer, an electron transfer layer, or a layer carrying out electron injection and transfer at the same time.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or SnO$_2$:Sb; conductive polymers such as poly(3-methyl compound), poly[3,4-(ethylene-1,2-dioxy)compound] (PEDT), polypyrrole and polyaniline, and the like, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or LiO$_2$/Al, and the like, but are not limited thereto.

The hole injection material is a material favorably receiving holes from an anode at a low voltage, and the highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer material is a material capable of receiving holes from an anode or a hole injection layer and moving the holes to a light emitting layer, and materials having high mobility for the holes are suitable. Specific examples thereof include arylamine-based organic materials, conductive polymers, block copolymers having conjugated parts and non-conjugated parts together, and the like, but are not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxy-quinoline aluminum complexes ($Alq_3$); carbazole-based compounds; dimerized styryl compounds; BAlq; 10-hydroxybenzoquinoline-metal compounds; benzoxazole-, benzothiazole- and benzimidazole-based compounds; poly(p-phenylenevinylene) (PPV)-based polymers; spiro compounds; polyfluorene, rubrene, or the like, but are not limited thereto.

The light emitting layer may include a host material and a dopant material. The host material includes fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes carbazole derivatives, dibenzofuran derivatives, ladder-type furan compounds, pyrimidine derivatives and the like, however, the material is not limited thereto.

When the organic light emitting device includes a plurality of organic material layers, the organic material layers may be formed with materials that are the same as or different from each other.

The organic light emitting device of the present specification may be manufactured using materials and methods known in the art, except that one or more layers of the organic material layers are formed using the coating composition including the copolymer.

For example, the organic light emitting device of the present specification may be manufactured by consecutively laminating an anode, an organic material layer and a cathode on a substrate. Herein, the organic light emitting device may be manufactured by forming an anode on a substrate by depositing a metal, a metal oxide having conductivity, or an alloy thereof using a physical vapor deposition (PVD) method such as sputtering or e-beam evaporation, and, after forming an organic material layer including a hole injection layer, a hole transfer layer, a light emitting layer and an electron transfer layer thereon, depositing a material capable of being used as a cathode thereon. In addition to such a method, the organic light emitting device may also be manufactured by consecutively depositing a cathode material, an organic material layer and an anode material on a substrate.

One embodiment of the present specification also provides a method for manufacturing an organic light emitting device formed using the coating composition.

Specifically, the method for manufacturing an organic light emitting device in one embodiment of the present specification includes preparing a substrate; forming a cathode or an anode on the substrate; forming one or more organic material layers on the cathode or the anode; and forming an anode or a cathode on the organic material layer, wherein one or more layers of the organic material layers are formed using the coating composition or a cured material thereof.

The forming of one or more layers of the organic material layers using the coating composition may include drying after coating the coating composition. As necessary, the drying may include curing.

In one embodiment of the present specification, the organic material layer formed using the coating composition is formed using a solution process.

In another embodiment, the organic material layer formed using the coating composition is formed using a printing method.

In an embodiment of the present specification, examples of the printing method include inkjet printing, nozzle printing, offset printing, transfer printing, screen printing or the like, but are not limited thereto.

The coating composition according to one embodiment of the present specification is suited for a solution process due to its structural properties and may be formed using a printing method, and therefore, is economically effective in terms of time and costs when manufacturing a device.

In one embodiment of the present specification, the forming of an organic material layer formed using the coating composition includes heat treating or vacuum drying. Through the heat treating or vacuum drying, a residual solvent is removed.

In one embodiment of the present specification, the heat treating or vacuum drying may include curing.

In one embodiment of the present specification, as the polymer binder, those that do not extremely inhibit charge transfer are preferred, and those that do not exhibit strong absorption for visible light are preferably used. Examples of the polymer binder include poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonate, polyacrylate, polymethyl acrylate, polymethyl methacrylate, polystyrene, polyvinyl chloride, polysiloxane and the like.

The dopant material includes aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group and includes arylamino group-including pyrene, anthracene, chrysene, peryflanthene and the like, and the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group are substituted or unsubstituted. Specifically, styrylamine, styryldiamine, styryltriamine, styryltetramine or the like is included, however, the styrylamine compound is not limited thereto. In addition, the metal complex includes iridium complexes, platinum complexes or the like, but is not limited thereto.

The electron transfer material is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suitable. Specific examples thereof include Al complexes of 8-hydroxyquinoline; complexes including $Alq_3$; organic radical compounds; hydroxyflavon-metal complexes, or the like, but are not limited thereto. The electron transfer layer may be used together with any desired cathode material as used in the art. Particularly, examples of the suitable cathode material include common materials that have small work function, and in which an aluminum layer or a silver layer follows. Specifically, the cathode material includes cesium, barium, calcium, ytterbium and samarium, and in each case, an aluminum layer or a silver layer follows.

The electron injection layer is a layer that injects electrons from an electrode, and the electron injection material is preferably a compound that has an ability to transfer electrons, has an electron injection effect from a cathode, has an excellent electron injection effect for a light emitting layer or a light emitting material, prevents excitons generated in the light emitting layer from moving to a hole injection layer, and in addition, has an excellent thin film forming ability. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited there.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)berylium, bis(10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, and generally, may be formed under the same condition as the hole injection layer. Specifically, oxadiazole derivatives or triazole derivatives, phenanthroline derivatives, BCP, aluminum complexes and the like are included, however, the material is not limited thereto.

The organic light emitting device according to the present specification may be a top-emission type, a bottom-emission type or a dual-emission type depending on the materials used.

A method for preparing the copolymer and manufacturing of the organic light emitting device using these will be specifically described in the following examples. However, the following examples are for illustrative purposes only, and the scope of the present disclosure is not limited thereto.

Preparation Example 1. Preparation of Monomer 1

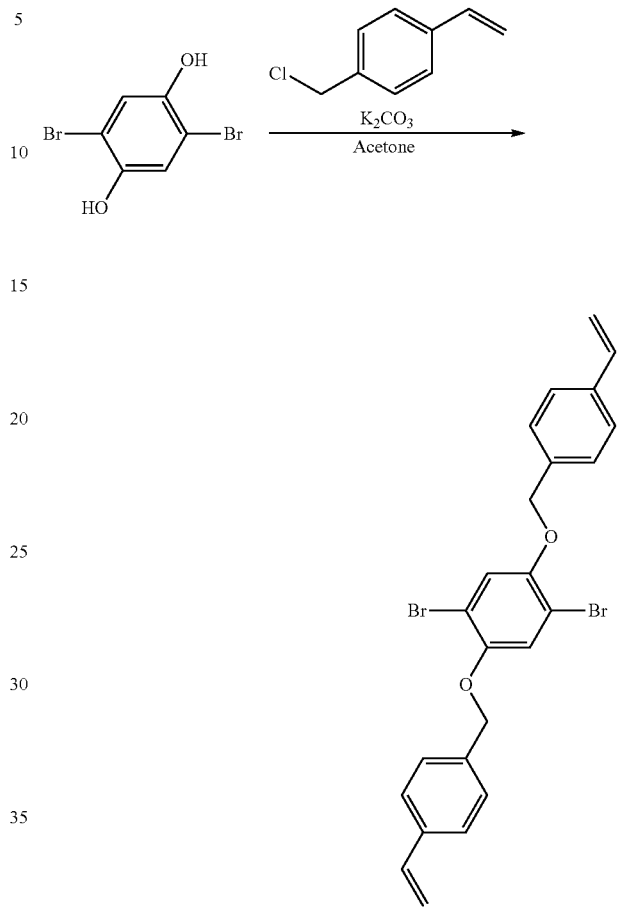

After dissolving 2,5-dibromohydroquinone (10 g, 37 mmol) and 4-vinylbenzyl chloride (13 mL, 93 mmol) in acetone, potassium carbonate [$K_2CO_3$] (21 g, 149 mmol) was introduced thereto, and the result was refluxed overnight. After the reaction was finished, the result was washed with water to remove $K_2CO_3$, filtered through silica to which a small amount of tetraethylamine [TEA] was added, and recrystallized with ethyl acetate [EA] to obtain Monomer 1. NMR data of Monomer 1 are as follows.

1H NMR (500 MHz): δ=7.45-7.40 (m, 8H), 7.17 (s, 2H), 6.76-6.70 (m, 2H), 5.77 (d, 2H), 5.26 (d, 2H), 5.07 (s, 4H)

Preparation Example 2. Preparation of Monomer 2

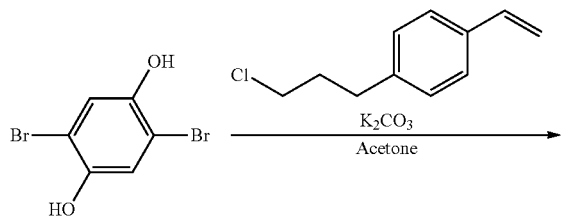

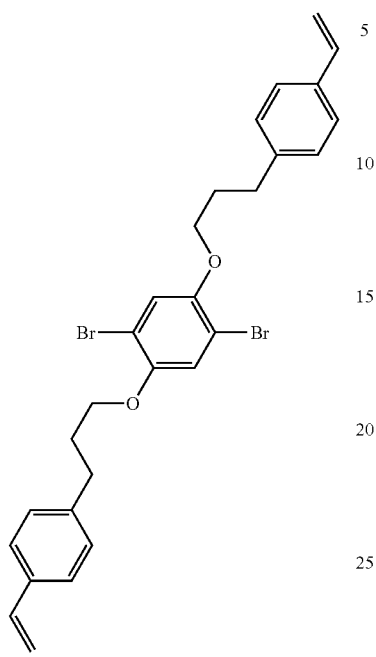

After dissolving 2,5-dibromohydroquinone (10 g, 37 mmol) and 1-(3-chloropropyl)-4-vinylbenzene (15 mL, 110 mmol) in acetone, potassium carbonate [K₂CO₃] (21 g, 149 mmol) was introduced thereto, and the result was refluxed overnight. After the reaction was finished, the result was washed with water to remove K₂CO₃, filtered through silica to which a small amount of tetraethylamine [TEA] was added, and recrystallized with ethyl acetate [EA] to obtain Monomer 2. NMR data of Monomer 2 are as follows.

1H NMR (500 MHz): δ=7.45-7.40 (m, 8H), 7.17 (s, 2H), 6.76-6.70 (m, 2H), 5.77 (d, 2H), 5.26 (d, 2H), 4.27 (t, 4H), 2.90 (t, 4H), 2.19-2.15 (m, 4H)

Preparation Example 3. Preparation of Monomer 3

1) Preparation of Intermediate 3-1

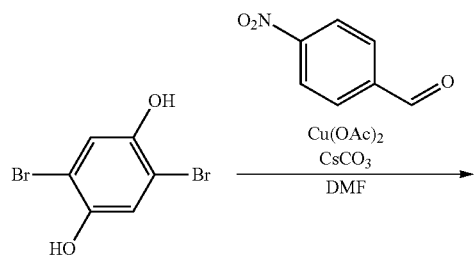

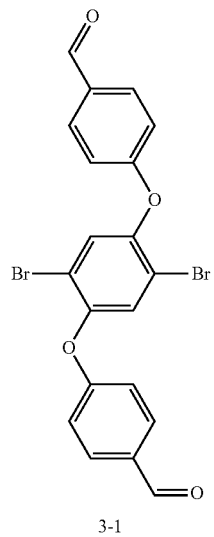

3-1

2,5-Dibromohydroquinone (28.5 g, 106.5 mmol), 4-nitrobenzaldehyde (23.6 g, 127.8 mmol) and cesium carbonate [CsCO3] (104 g, 319.50 mmol) were introduced and dissolved in N,N'-dimethylformamide [DMF] (200 ml, 0.5 M). After that, copper(II) acetate (17.0 g, 213.0 mmol) was slowly added thereto, and the result was refluxed after raising the temperature to 120° C. to proceed a reaction. After the reaction was finished, the reaction was terminated with a saturated aqueous NaHCO₃ solution, and the organic layer was extracted with ethyl acetate [EA]. After drying the organic layer using magnesium sulfate, crude obtained by removing the solvent was dissolved in dichloromethane, and precipitated in ethanol to obtain Intermediate 3-1, a solid. 1H NMR data of Intermediate 3-1 are as follows.

1H NMR (500 MHz): δ=10.25 (s, 2H), 7.92 (d, 4H), 7.46 (d, 4H), 7.17 (s, 2H)

2) Preparation of Monomer 3

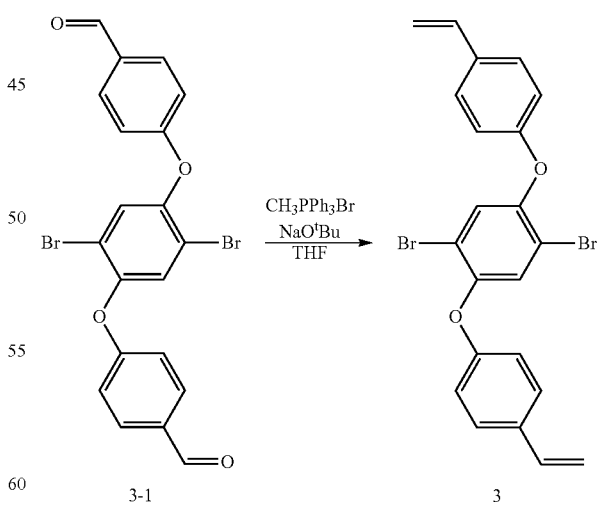

Methyltriphenylphosphonium bromide (22.5 g, 63 mmol) was introduced to a round bottom flask, dissolved in tetrahydrofuran [anhydrous THF], and the temperature was lowered to 0° C. Sodium tert-butoxide (7.07 g, 63 mmol) was introduced thereto at once, and the result was cooled at 0° C.

and stirred for 30 minutes. After dissolving Intermediate 3-1 (10 g, 21 mmol) in tetrahydrofuran [anhydrous THF], the result gradually added to the mixture using a dropping funnel. Water was introduced thereto to terminate the reaction, and the organic layer was extracted with ethyl acetate [EA]. After drying the organic layer using magnesium sulfate [MgSO₄], the solvent was removed, and the result was columned [flash chromatography] to obtain Monomer 3. 1H NMR data of Monomer 3 are as follows.

1H NMR (500 MHz): δ=7.62 (d, 4H), 7.20 (s, 2H) 7.16 (d, 4H), 6.73 (m, 2H), 5.76 (d, 2H), 5.24 (d, 2H).

Preparation Example 4. Preparation of Monomer 4

1) Preparation of Intermediate 4-1

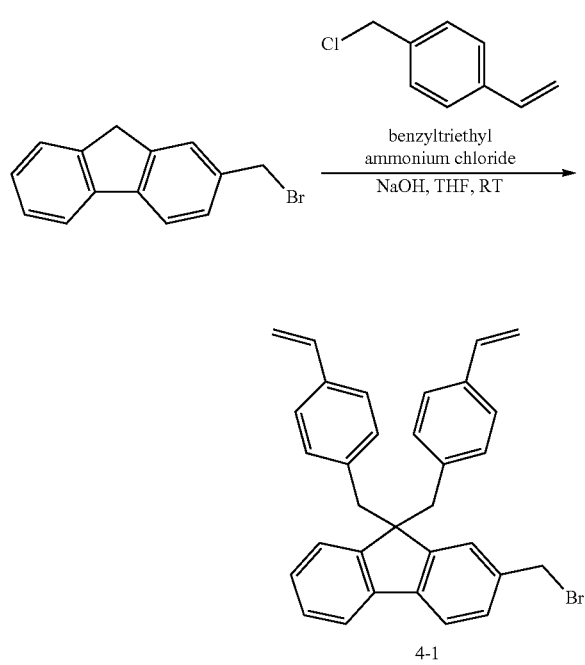

4-1

After introducing and dissolving 2-(bromomethyl)-9H-fluorene (10 g, 38.6 mmol) and benzyltriethylammonium chloride (879 mg, 3.86 mmol) in degassed tetrahydrofuran [THF], NaOH (50 wt %, 3.86 mL) was dropped thereto, and the result was further stirred for 1 hour. After introducing 4-chloromethyl styrene (10.9 mL, 77.2 mmol) thereto, the result was stirred overnight at room temperature. Water was introduced thereto to terminate the reaction, and the organic layer was extracted with ethyl acetate [EA]. After drying the organic layer using magnesium sulfate [MgSO₄], the solvent was removed, and the result was columned [flash chromatography] to obtain Intermediate 4-1.

FIG. 2 shows LCMS data of Intermediate 4-1.
2) Preparation of Monomer 4

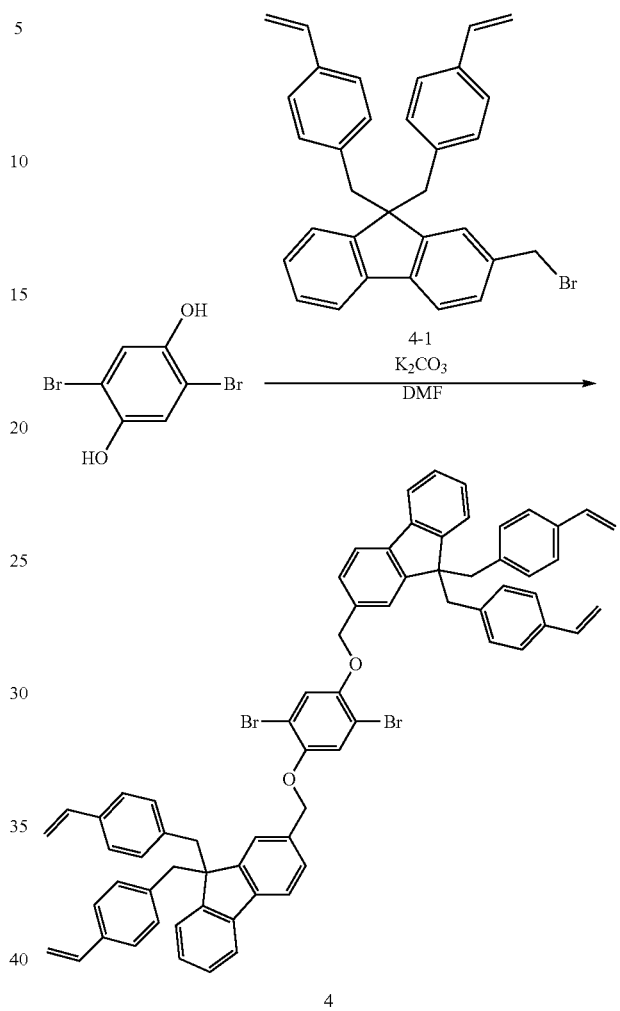

4

After dissolving 2,5-dibromohydroquinone (1 g, 3.7 mmol) and 2-(bromomethyl)-9,9-bis(4-vinylbenzyl)-9H-fluorene (5.4 g, 11 mmol) in N,N'-dimethylformamide [DMF], potassium carbonate [K₂CO₃] (2.1 g, 15 mmol) was introduced thereto, and the result was refluxed overnight. After the reaction was finished, the result was washed with water to remove K₂CO₃, and the organic layer was extracted with ethyl acetate [EA]. After drying the organic layer using magnesium sulfate [MgSO₄], the solvent was removed, and the result was columned [flash chromatography] to obtain Monomer 4.

FIG. 3 shows LCMS data of Monomer 4.

Preparation Example 5. Preparation of Monomer 5

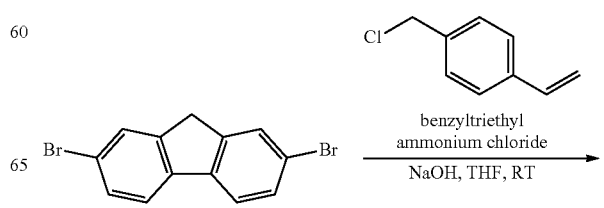

-continued

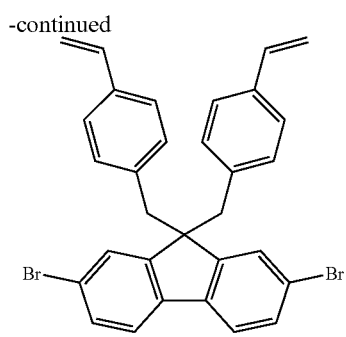

After introducing and dissolving 2-(bromo)-9H-fluorene (10 g, 30.9 mmol) and benzyltriethylammonium chloride (879 mg, 3.1 mmol) in degassed tetrahydrofuran [THF], NaOH (50 wt %, 3.1 mL) was dropped thereto, and the result was further stirred for 1 hour. After introducing 4-chloromethyl styrene (10.9 mL, 77.2 mmol) thereto, the result was stirred overnight at room temperature. Water was introduced thereto to terminate the reaction, and the organic layer was extracted with ethyl acetate [EA]. After drying the organic layer using magnesium sulfate [MgSO$_4$], the solvent was removed, and the result was columned [flash chromatography] to obtain Monomer 5.

FIG. 4 shows LCMS data of Monomer 5.

Preparation Example 6. Preparation of Copolymer 1

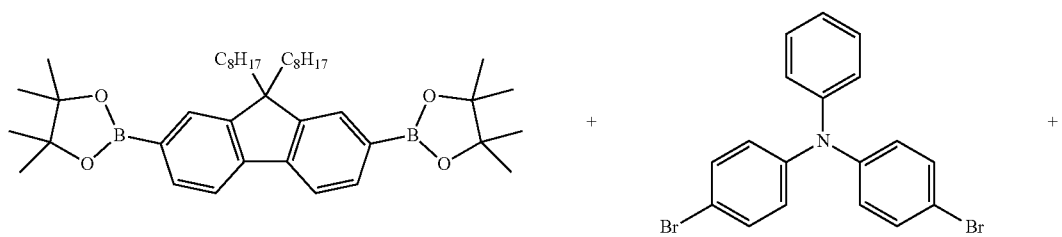

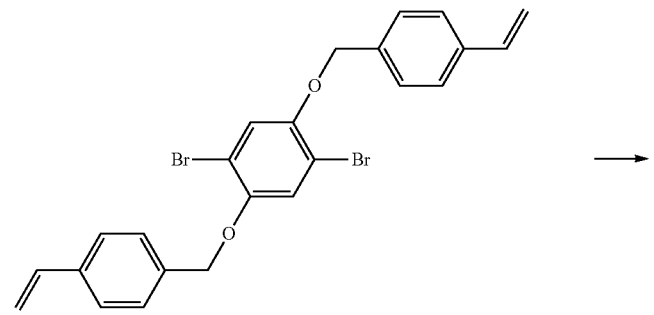

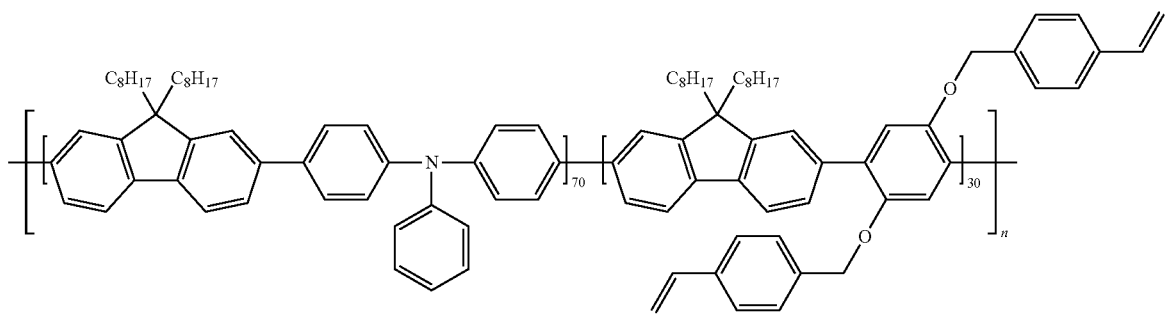

Monomer 6 [2,2'-(9,9-dioctyl-9H-fluorene-2,7-diyl)bis(4,4,5,5-tetramethyl-1,3,2-dioxaborolane)] (1 g, 1.56 mmol), Monomer 7 4-bromo-N-(4-bromophenyl)-N-phenylaniline (439.4 mg, 1.09 mmol) and Monomer 1 (260.3 mg. 0.47 mmol) were accurately weighed and dissolved in degassed toluene. The temperature was raised to 90° C., degassed tetraethylammonium hydroxide [Et$_4$NOH] (20 wt % aqueous, 5 mL) was introduced thereto, and the result was stirred for 30 minutes. After that, Pd(PPh$_3$)$_4$ (90.1 mg, 0.078 mmol) dissolved in toluene was introduced thereto to proceed a Suzuki reaction. The reaction was terminated by endcapping, and solids produced through precipitating in methanol were filtered to obtain Copolymer 1.

A weight average molecular weight of Copolymer 1 was measured as 91 kg/mol.

Preparation Example 7. Preparation of Copolymer 2

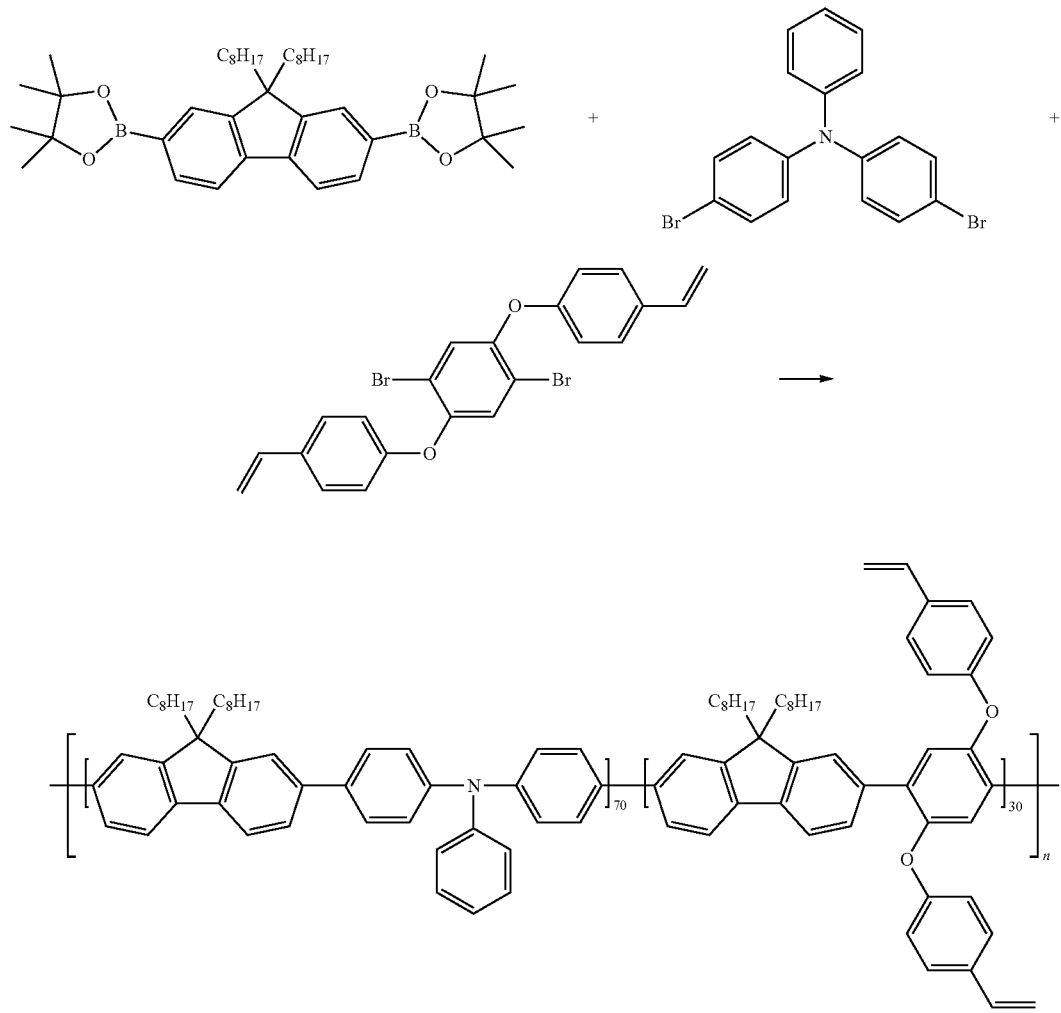

Monomer 6 [2,2'-(9,9-dioctyl-9H-fluorene-2,7-diyl)bis(4,4,5,5-tetramethyl-1,3,2-dioxaborolane)] (1 g, 1.56 mmol), Monomer 7 4-bromo-N-(4-bromophenyl)-N-phenylaniline (439.4 mg, 1.09 mmol) and Monomer 3 (245.7 mg. 0.47 mmol) were accurately weighed and dissolved in degassed toluene. The temperature was raised to 90° C., degassed tetraethylammonium hydroxide [Et$_4$NOH] (20 wt % aqueous, 5 mL) was introduced thereto, and the result was stirred for 30 minutes. After that, Pd(PPh$_3$)$_4$ (90.1 mg, 0.078 mmol) dissolved in toluene was introduced thereto to proceed a Suzuki reaction. The reaction was terminated by endcapping, and solids produced through precipitating in methanol were filtered to obtain Copolymer 2. A weight average molecular weight of Copolymer 2 was measured as 45 kg/mol.

Preparation Example 8. Preparation of Copolymer 3

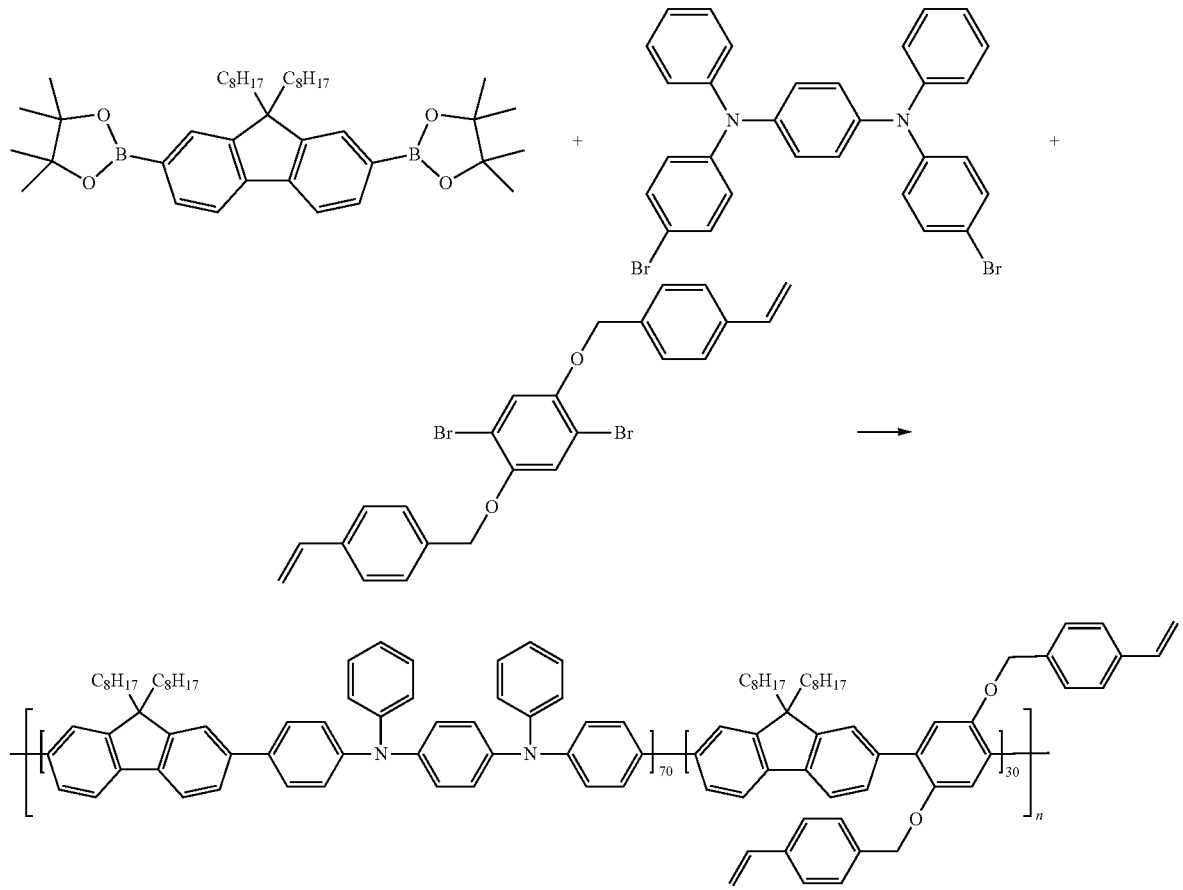

Monomer 6 [2,2'-(9,9-dioctyl-9H-fluorene-2,7-diyl)bis(4,4,5,5-tetramethyl-1,3,2-dioxaborolane)] (1 g, 1.56 mmol), Monomer 9 $N^1,N^4$-bis(4-bromophenyl)-$N^1,N^4$-diphenyl-benzene-1,4-diamine (621.66 mg, 1.09 mmol) and Monomer 1 (260.3 mg. 0.47 mmol) were accurately weighed and dissolved in degassed toluene. The temperature was raised to 90° C., degassed tetraethylammonium hydroxide [$Et_4NOH$] (20 wt % aqueous, 5 mL) was introduced thereto, and the result was stirred for 30 minutes. After that, Pd(PPh$_3$)$_4$ (90.1 mg, 0.078 mmol) dissolved in toluene was introduced thereto to proceed a Suzuki reaction. The reaction was terminated by endcapping, and solids produced through precipitating in methanol were filtered to obtain Copolymer 3. A weight average molecular weight of Copolymer 3 was measured as 58 kg/mol.

Preparation Example 9. Preparation of Copolymer 4

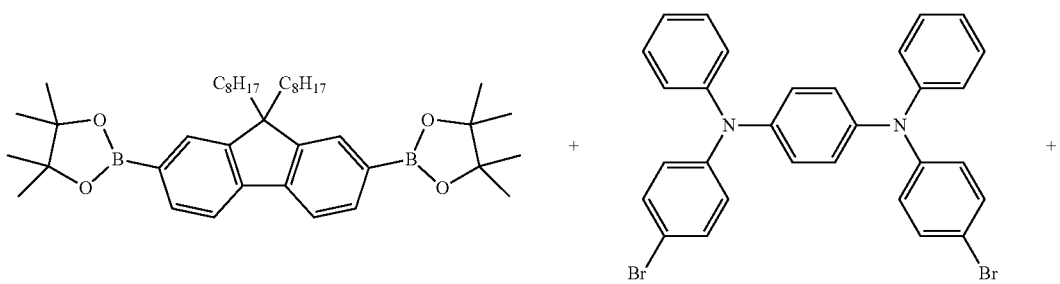

-continued

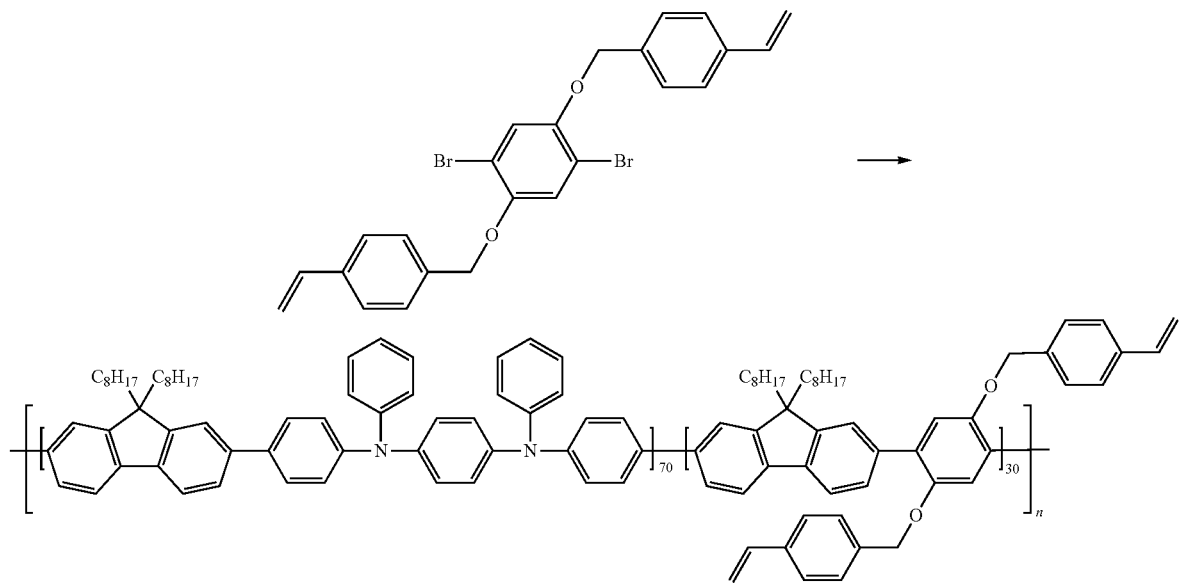

Monomer 6 [2,2'-(9,9-dioctyl-9H-fluorene-2,7-diyl)bis(4,4,5,5-tetramethyl-1,3,2-dioxaborolane)] (1 g, 1.56 mmol), Monomer 9 $N^1,N^4$-bis(4-bromophenyl)-$N^1,N^4$-diphenyl-benzene-1,4-diamine (621.66 mg, 1.09 mmol) and Monomer 2 (261.5 mg. 0.47 mmol) were accurately weighed and dissolved in degassed toluene. The temperature was raised to 90° C., degassed tetraethylammonium hydroxide [Et$_4$NOH] (20 wt % aqueous, 5 mL) was introduced thereto, and the result was stirred for 30 minutes. After that, Pd(PPh$_3$)$_4$ (90.1 mg, 0.078 mmol) dissolved in toluene was introduced thereto to proceed a Suzuki reaction. The reaction was terminated by endcapping, and solids produced through precipitating in methanol were filtered to obtain Copolymer 4. A weight average molecular weight of Copolymer 4 was measured as 88 kg/mol.

Preparation Example 10. Preparation of Copolymer 5

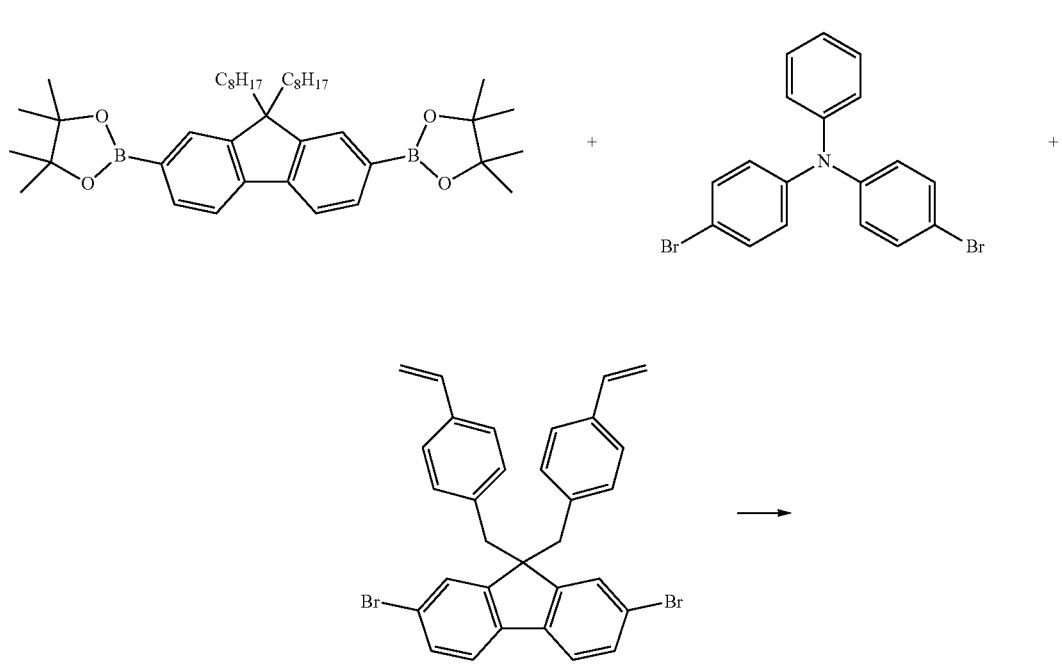

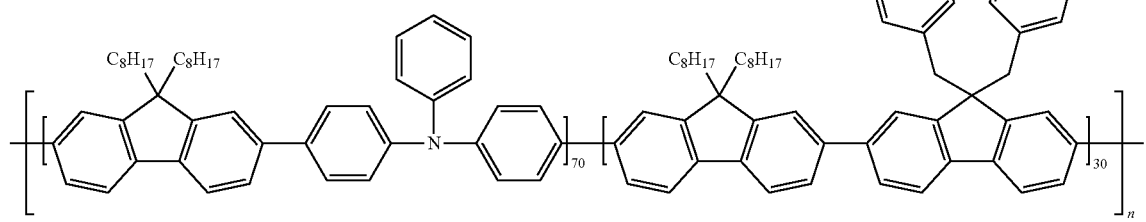

Monomer 6 [2,2'-(9,9-dioctyl-9H-fluorene-2,7-diyl)bis(4,4,5,5-tetramethyl-1,3,2-dioxaborolane)] (1 g, 1.56 mmol), Monomer 7 4-bromo-N-(4-bromophenyl)-N-phenylaniline (439.4 mg, 1.09 mmol) and Monomer 5 (216.5 mg. 0.47 mmol) were accurately weighed and dissolved in degassed toluene. The temperature was raised to 90° C., degassed tetraethylammonium hydroxide [Et$_4$NOH] (20 wt % aqueous, 5 mL) was introduced thereto, and the result was stirred for 30 minutes. After that, Pd(PPh$_3$)$_4$ (90.1 mg, 0.078 mmol) dissolved in toluene was introduced thereto to proceed a Suzuki reaction. The reaction was terminated by endcapping, and solids produced through precipitating in methanol were filtered to obtain Copolymer 5. A weight average molecular weight of Copolymer 5 was measured as 31 kg/mol.

Preparation Example 11. Preparation of Copolymer 6

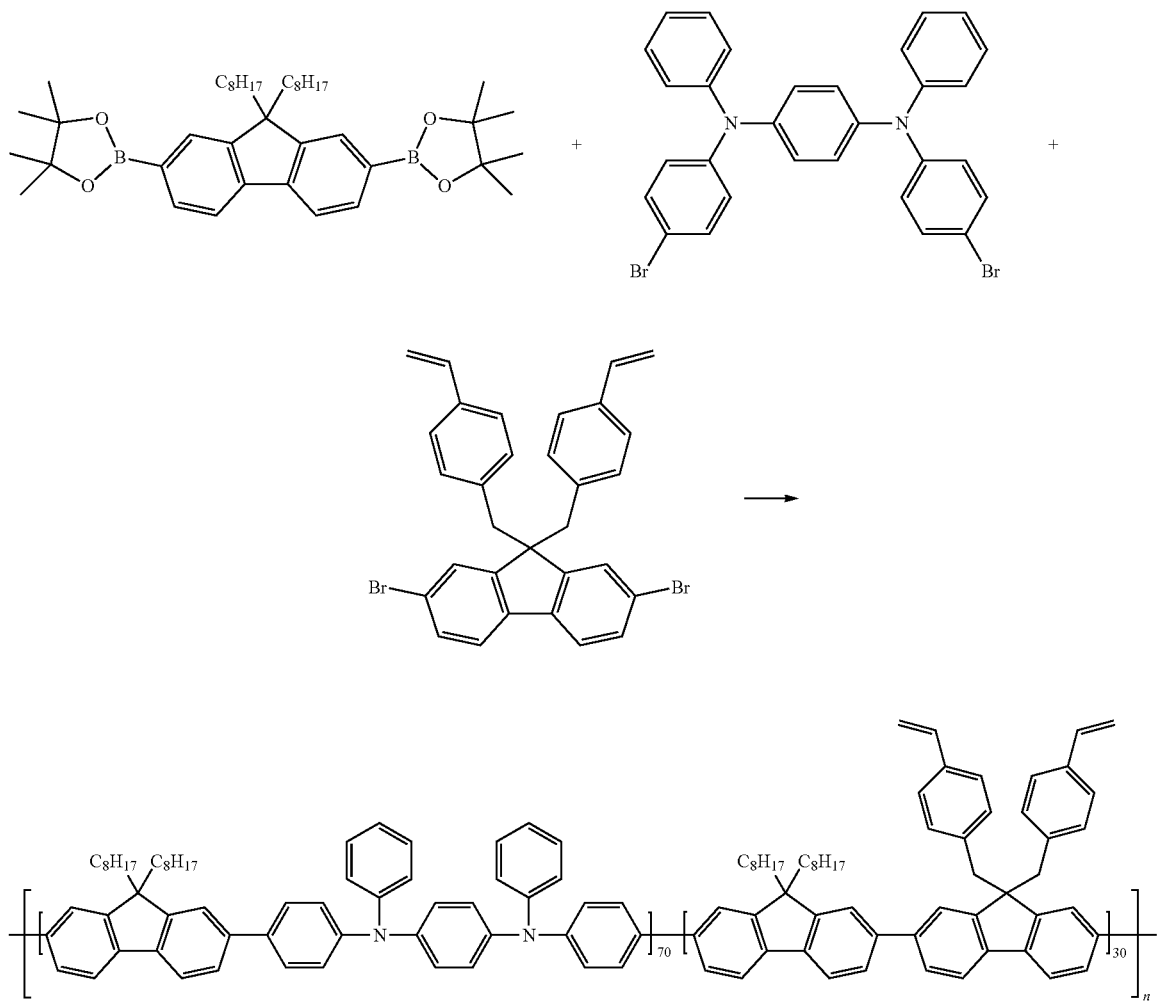

Monomer 6 [2,2'-(9,9-dioctyl-9H-fluorene-2,7-diyl)bis(4,4,5,5-tetramethyl-1,3,2-dioxaborolane)] (1 g, 1.56 mmol), Monomer 9 $N^1,N^4$-bis(4-bromophenyl)-$N^1,N^4$-diphenyl-benzene-1,4-diamine (621.66 mg, 1.09 mmol) and Monomer 5 (216.5 mg, 0.47 mmol) were accurately weighed and dissolved in degassed toluene. The temperature was raised to 90° C., degassed tetraethylammonium hydroxide [$Et_4NOH$] (20 wt % aqueous, 5 mL) was introduced thereto, and the result was stirred for 30 minutes. After that, $Pd(PPh_3)_4$ (90.1 mg, 0.078 mmol) dissolved in toluene was introduced thereto to proceed a Suzuki reaction. The reaction was terminated by endcapping, and solids produced through precipitating in methanol were filtered to obtain Copolymer 6. A weight average molecular weight of Copolymer 6 was measured as 30 kg/mol.

Example 1

A glass substrate on which indium tin oxide (ITO) was coated as a thin film to a thickness of 1500 Å was placed in detergent-dissolved distilled water and ultrasonic cleaned. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol and acetone for 30 minutes each, then dried, and then transferred to a glove box.

On the transparent ITO electrode prepared as above, a hole injection layer having a thickness of 300 Å was formed by spin coating PEDOT:PSS, and in the air, the coating composition was cured for 1 hour on a hot plate.

After being transferred to the glove box, a hole transfer layer was formed on the hole injection layer to 200 Å by dissolving Copolymer 1 in a toluene solution (2 wt %). This coating composition was cured for 30 minutes on a hot plate.

Subsequently, a light emitting layer was formed on the hole transfer layer by vacuum depositing the following $Alq_3$ to 50 nm. A cathode was formed on the electron transfer layer by depositing LiF to a thickness of 0.5 nm and aluminum to a thickness of 100 nm.

In the above-mentioned processes, the deposition rates of the organic materials were maintained at 0.4 Å/sec to 0.7 Å/sec, the deposition rates of the LiF and the aluminum of the cathode were maintained at 0.3 Å/sec and 2 Å/sec, respectively, and the degree of vacuum during the deposition was maintained at $2 \times 10^{-7}$ to $3 \times 10^{-5}$ torr.

Example 2

An organic light emitting device was manufactured in the same manner as in Example 1 except that Copolymer 2 was used instead of Copolymer 1.

Example 3

An organic light emitting device was manufactured in the same manner as in Example 1 except that Copolymer 3 was used instead of Copolymer 1.

Example 4

An organic light emitting device was manufactured in the same manner as in Example 1 except that Copolymer 4 was used instead of Copolymer 1.

Comparative Example 1

An organic light emitting device was manufactured in the same manner as in Example 1 except that Copolymer 5 was used instead of Copolymer 1.

Comparative Example 2

An organic light emitting device was manufactured in the same manner as in Example 1 except that Copolymer 6 was used instead of Copolymer 1.

For the organic light emitting devices manufactured in Examples 1 to 4 and Comparative Examples 1 and 2, a driving voltage, current efficiency, quantum efficiency (QE) and a luminance value were measured at current density of 10 $mA/cm^2$, and time taken for the luminance becoming 90% compared to its initial luminance (T90) was measured at current density of 10 $mA/cm^2$. The results are shown in the following Table 1.

TABLE 1

|  | Driving Voltage (V) | Current Efficiency (cd/A) | QE (%) | Luminance (cd/m$^2$) | Lifetime T90 (10 mA/cm$^2$) |
|---|---|---|---|---|---|
| Example 1 | 4.92 | 5.70 | 5.56 | 488.0 | 64.5 |
| Example 2 | 5.01 | 6.04 | 5.44 | 504.0 | 65.1 |
| Example 3 | 4.47 | 6.80 | 5.23 | 476.4 | 59.1 |
| Example 4 | 4.75 | 6.97 | 5.41 | 505.5 | 65.0 |
| Comparative Example 1 | 6.71 | 5.02 | 4.40 | 414.7 | 35.3 |
| Comparative Example 2 | 6.75 | 5.80 | 4.62 | 433.3 | 32.3 |

Comparative Examples 1 and 2 do not include structures corresponding to Chemical Formula 1 of the present disclosure.

As a result, it was identified from the results of Table 1 that Examples 1 to 4 manufacturing an organic light emitting device using the copolymer of the present disclosure had a lower driving voltage, excellent current efficiency and quantum efficiency, and also had excellent lifetime properties compared to the organic light emitting devices manufactured in Comparative Examples 1 and 2.

The invention claimed is:
1. A copolymer comprising:
a unit of the following Chemical Formula 1;
a unit of the following Chemical Formula 2; and
a unit of the following Chemical Formula 3,

[Chemical Formula 1]

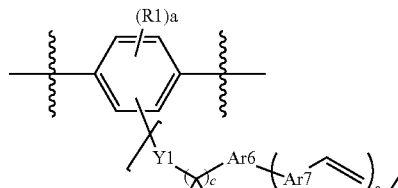

[Chemical Formula 2]

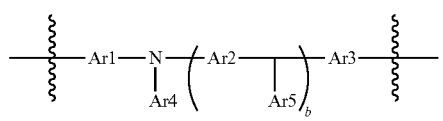

wherein, in Chemical Formulae 1 and 2,
Y1 is O;
R1 is hydrogen; deuterium; a halogen group; a substituted or unsubstituted alkyl group; a substituted or unsubstituted alkoxy group; a substituted or unsubstituted cycloalkyl group; a substituted or unsubstituted aryl group; or a substituted or unsubstituted heterocyclic group;
Ar1 to Ar3 are the same as or different from each other, and each independently a substituted or unsubstituted arylene group; or a substituted or unsubstituted heteroarylene group;
Ar4 and Ar5 are the same as or different from each other, and each independently hydrogen;
deuterium; a substituted or unsubstituted alkyl group; a substituted or unsubstituted aryl group; or a substituted or unsubstituted heteroaryl group;
Ar6 is a direct bond;
Ar7 is a substituted or unsubstituted arylene group;
Ar8 and Ar9 are the same as or different from each other, and each independently hydrogen;
deuterium; a halogen group; a nitrile group; a substituted or unsubstituted silyl group; a substituted or unsubstituted alkoxy group; a substituted or unsubstituted aryloxy group; a substituted or unsubstituted amine group; a substituted or unsubstituted alkyl group; a substituted or unsubstituted aryl group; or a substituted or unsubstituted heteroaryl group;
a is an integer of 0 to 3;
b is an integer of 0 or 1;
c is an integer of 0 to 10;
e is an integer of 1 or 2; and
f is an integer of 1 or 2;
when a is greater than 1, each of R1 is the same as or different from each other;
when e is 2, each of

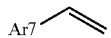

is the same as or different from each other; and
when f is 2, each of

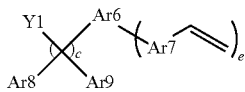

is the same as or different from each other,

[Chemical Formula 3]

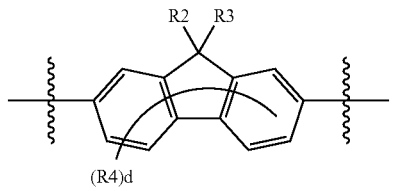

wherein, in Chemical Formula 3,
R2 and R3 are the same as or different from each other, and each independently an unsubstituted alkyl group;
R4 is hydrogen; deuterium; a halogen group; or a substituted or unsubstituted alkyl group; and
d is from 0 to 6;
when d is greater than 1, each of R4 is the same as or different from each other.

2. The copolymer of claim 1, comprising one, two or more of units represented by the following Chemical Formula 1-1 or Chemical Formula 1-2:

[Chemical Formula 1-1]

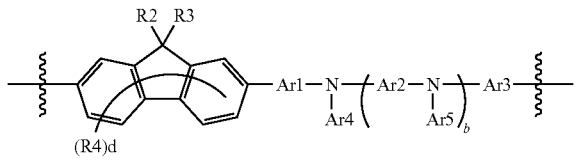

[Chemical Formula 1-2]

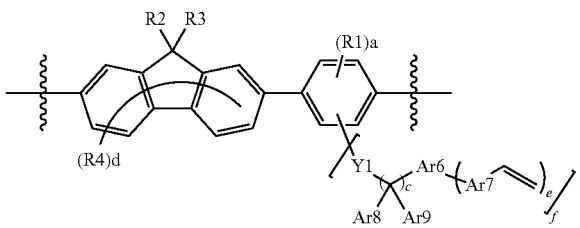

wherein, in Chemical Formulae 1-1 and 1-2,
R1 to R4, Ar1 to Ar9, Y1, and a to f have the same definitions as in Chemical Formulae 1 to 3.

3. The copolymer of claim 1, which is any one of the following structures:

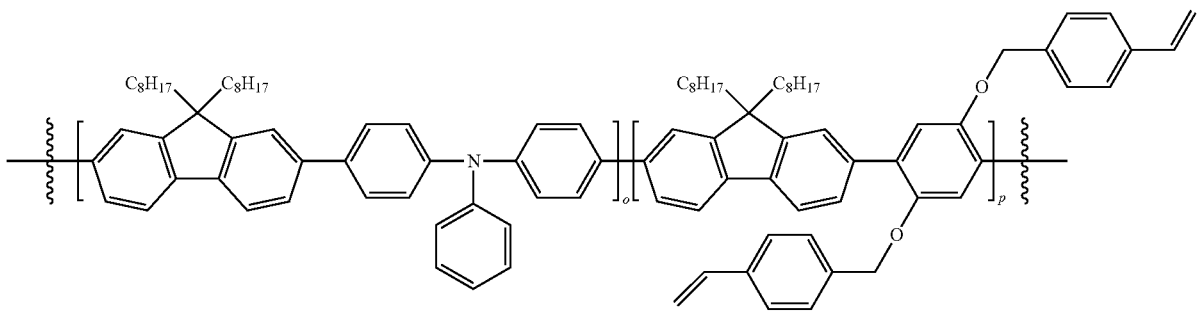

-continued
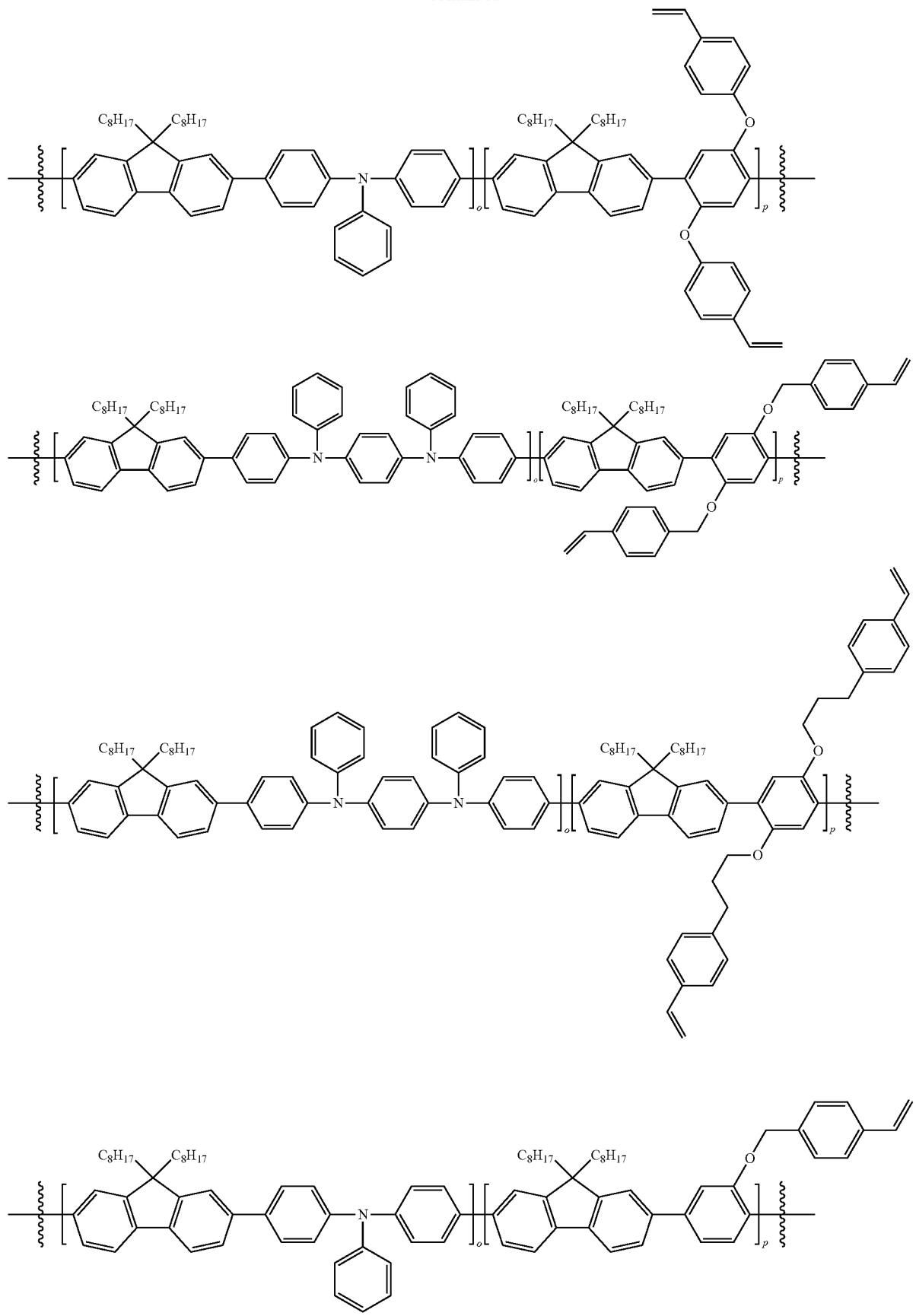

-continued

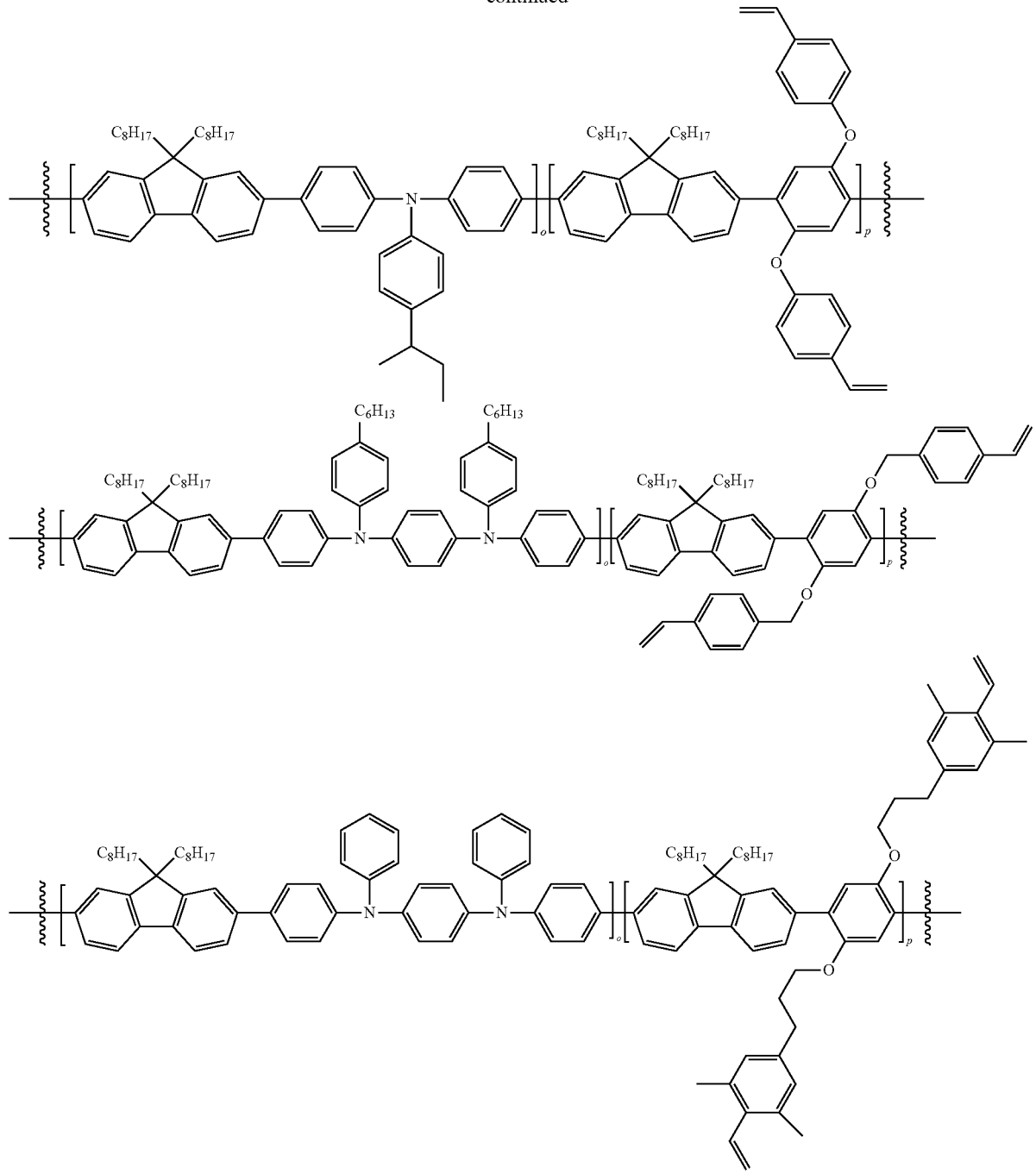

wherein, in the structural formulae,
and p are a molar ratio of each represented unit, and o+p=1,
is a molar ratio of 0.05 to 0.95, and p is a molar ratio of 0.05 to 0.95.

4. The copolymer of claim 1, which has a number average molecular weight of 1,000 g/mol to 1,000,000 g/mol.

5. A coating composition comprising the copolymer of claim 1.

6. An organic light emitting device comprising:
a first electrode;
a second electrode provided opposite to the first electrode; and
one or more organic material layers between the first electrode and the second electrode,
wherein one or more layers of the organic material layers include the coating composition of claim 5 or a cured material thereof.

7. The organic light emitting device of claim 6, wherein the organic material layer includes a hole transfer layer, a hole injection layer, or a layer carrying out hole transfer and hole injection at the same time; and
the hole transfer layer, the hole injection layer, or the layer carrying out hole transfer and hole injection at the same time includes the coating composition or a cured material thereof.

8. The organic light emitting device of claim 6, wherein the organic material layer includes an electron injection layer, an electron transfer layer, or a layer carrying out electron injection and electron transfer at the same time; and
the electron injection layer, the electron transfer layer, or the layer carrying out electron injection and electron transfer at the same time includes the coating composition or a cured material thereof.

9. A method for manufacturing an organic light emitting device comprising:
preparing a substrate;
forming a cathode or an anode on the substrate;
forming one or more organic material layers on the cathode or the anode; and
forming an anode or a cathode on the organic material layer,
wherein the forming of organic material layers includes forming one or more organic material layers using the coating composition of claim 5.

10. The method for manufacturing an organic light emitting device claim 9, wherein the forming of one or more organic material layers formed using the coating composition includes drying after coating the coating composition.

11. The copolymer of claim 1, wherein R1 and R4 are hydrogen; R2 and R3 are the same as or different from each other, and each independently a substituted or unsubstituted alkyl group having 1 to 20 carbon atoms; Ar1 to Ar3 are a phenylene group; Ar4 and Ar5 are the same as or different from each other, and each independently a phenyl group unsubstituted or substituted with an alkyl group; Ar6 is a direct bond; Ar7 is a phenylene group unsubstituted or substituted with a methyl group or F, or a fluorenylene group unsubstituted or substituted with a methyl group or a phenyl group; and Ar8 and Ar9 are hydrogen.

12. The copolymer of claim 1, which includes a structure represented by represented by the following Chemical Formula 1-3:

[Chemical Formula 1-3]

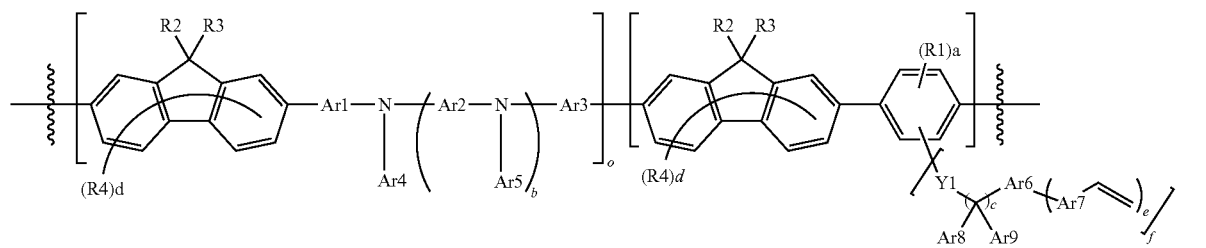

wherein, in Chemical Formula 1-3,
R1 to R4, Ar1 to Ar9, Y1, and a to f have the same definitions as in Chemical Formulae 1 to 3,
and p are a molar ratio of each represented unit, and o+p=1,
is a molar ratio of 0.05 to 0.95, and
p is a molar ratio of 0.05 to 0.95.

13. The copolymer of claim 1, wherein an end group of the copolymer is hydrogen or an alkyl group.

14. The coating composition of claim 5, wherein the copolymer is in a range of 1% by weight to 10% by weight.

* * * * *